US012751016B2

(12) United States Patent
Kanaya et al.

(10) Patent No.: US 12,751,016 B2
(45) Date of Patent: Sep. 29, 2026

(54) SEMICONDUCTOR STORAGE DEVICE AND MANUFACTURING METHOD THEREFOR

(71) Applicant: Kioxia Corporation, Tokyo (JP)

(72) Inventors: Hiroyuki Kanaya, Yokohama Kanagawa (JP); Masahiko Nakayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 275 days.

(21) Appl. No.: 18/587,939

(22) Filed: Feb. 26, 2024

(65) Prior Publication Data

US 2024/0292631 A1 Aug. 29, 2024

(30) Foreign Application Priority Data

Feb. 28, 2023 (JP) ................................ 2023-029906

(51) Int. Cl.
*H10B 61/00* (2023.01)

(52) U.S. Cl.
CPC .................................. *H10B 61/10* (2023.02)

(58) Field of Classification Search
None
See application file for complete search history.

(56) References Cited

U.S. PATENT DOCUMENTS 7,088,609 B2 8/2006 Valet
7,824,954 B2 11/2010 An et al.
9,105,572 B2 8/2015 Kanaya et al.
9,368,721 B1 6/2016 Bodke et al.
9,425,237 B2 8/2016 Jo
9,633,724 B2 4/2017 Jo et al.
(Continued)

FOREIGN PATENT DOCUMENTS

CN 107204351 A 9/2017
JP 2007-537608 A 12/2007
(Continued)

OTHER PUBLICATIONS

Lee et al., "Highly-Scalable Threshold Switching Select Device based on Chaclogenide Glasses for 3D Nanoscaled Memory Arrays" Conference: Electron Devices Meeting (IEDM), 2012 IEEE International, 2012, 3 pages.
(Continued)

*Primary Examiner* — Asok K Sarkar
(74) *Attorney, Agent, or Firm* — Kim & Stewart LLP

(57) ABSTRACT

A semiconductor storage device includes a plurality of first wirings extending in a first direction and a plurality of second wirings extending in a second direction intersecting the first direction. A plurality of memory cells are connected between the plurality of first wirings and the plurality of second wirings and include selectors each connected in series to variable resistance elements. Each selector includes a selector material switching a current flowing to the variable resistance element according to a voltage difference between the first wiring and the second wiring, and first and second electrodes sandwiching the selector material in a portion between the first wiring and the variable resistance element. A contact area between the first electrode and the selector material is less than an area of the selector material when viewed in a stacking direction of the selector and the variable resistance element.

20 Claims, 29 Drawing Sheets

(56) References Cited

U.S. PATENT DOCUMENTS

| | | | |
|---|---|---|---|
| 9,691,816 | B2 | 6/2017 | Han et al. |
| 10,177,308 | B2 | 1/2019 | Yang et al. |
| 10,374,013 | B2 | 8/2019 | Bandyopadhyay et al. |
| 10,707,269 | B2 | 7/2020 | Nagase et al. |
| 2005/0263069 | A1* | 12/2005 | Lundahl .................... B65C 9/40 118/712 |
| 2008/0217669 | A1 | 9/2008 | Kanaya |
| 2016/0149128 | A1 | 5/2016 | Bodke et al. |
| 2017/0170237 | A1* | 6/2017 | Jung ...................... H10N 50/10 |
| 2017/0200767 | A1 | 7/2017 | Han |
| 2017/0271581 | A1 | 9/2017 | Seong et al. |
| 2018/0040669 | A1* | 2/2018 | Wu ........................ H10B 61/10 |
| 2019/0288032 | A1 | 9/2019 | Furuhashi |
| 2019/0296078 | A1* | 9/2019 | Ito .......................... H10N 50/80 |
| 2020/0083285 | A1 | 3/2020 | Nagase et al. |
| 2020/0083443 | A1 | 3/2020 | Ito et al. |
| 2020/0091238 | A1 | 3/2020 | Sanuki et al. |
| 2020/0185016 | A1* | 6/2020 | Sakhare ................. H10N 50/85 |
| 2020/0303454 | A1* | 9/2020 | Furuhashi ........... G11C 11/1675 |
| 2020/0388752 | A1 | 12/2020 | Bai et al. |
| 2021/0257413 | A1 | 8/2021 | Kanaya |
| 2021/0296568 | A1 | 9/2021 | Igarashi et al. |
| 2021/0343787 | A1 | 11/2021 | Goto |
| 2022/0302383 | A1 | 9/2022 | Zhang et al. |
| 2023/0142183 | A1* | 5/2023 | Dong ................... H10N 70/826 438/3 |
| 2023/0309428 | A1 | 9/2023 | Fukuda et al. |

FOREIGN PATENT DOCUMENTS

| | | | |
|---|---|---|---|
| JP | 2008-218842 | A | 9/2008 |
| JP | 2009-021602 | A | 1/2009 |
| JP | 2013-062327 | A | 4/2013 |
| JP | 2019-161179 | A | 9/2019 |
| JP | 2020-043131 | A | 3/2020 |
| JP | 2020-047663 | A | 3/2020 |
| JP | 2021-129071 | A | 9/2021 |
| JP | 2022-146047 | A | 10/2022 |
| JP | 2023-140374 | A | 10/2023 |
| TW | 202143472 | A | 11/2021 |

OTHER PUBLICATIONS

Lopez et al., "Ge—Se—Sb—N-based OTS scaling perspectives for high-density 1S1R crossbar arrays" 2021 IEEE International Memory Workshop (IMW), IEEE, 2021, 4 pages.

* cited by examiner

| MATERIAL | STRUCTURE | THERMAL CONDUCTIVITY (W/m·K) | ELECTRIC RESISTIVITY (Ω·cm) |
|---|---|---|---|
| BeO | WURTZITE TYPE | 250 | 1.E+16 |
| AlN | WURTZITE TYPE | 285 | 1.E+14 |
| MgO | ROCK SALT TYPE | 59 | 1.E+14 |
| $Si_3N_4$ | HEXAGONAL CRYSTAL | 25-54 | 1.E+14 |
| $SiO_2$ | | 1.4 | 1.E+16 |

SEMICONDUCTOR STORAGE DEVICE AND MANUFACTURING METHOD THEREFOR

CROSS-REFERENCE TO RELATED APPLICATION(S)

This application is based upon and claims the benefit of priority from Japanese Patent Application No. 2023-029906, filed Feb. 28, 2023, the entire contents of which are incorporated herein by reference.

FIELD

Embodiments described herein relate generally to a semiconductor storage device and a manufacturing method therefor.

BACKGROUND

Semiconductor storage devices in which variable resistance elements are used are known. When data is written in or data is read from selected cells of such semiconductor storage devices, there is a problem of off-leakage currents occurring in unselected cells other than the selected cells.

DETAILED DESCRIPTION

Figure 1:
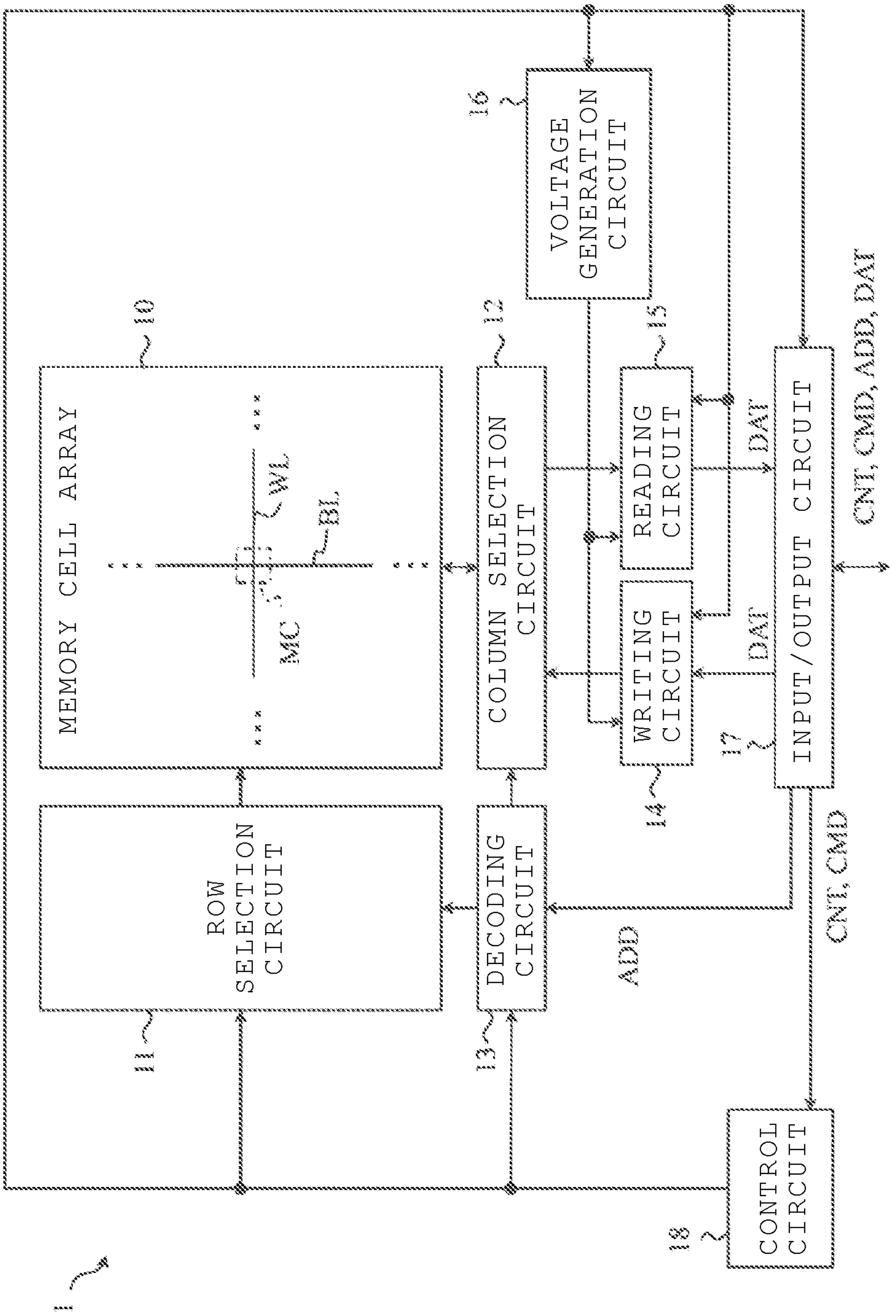
FIG. 1 is a block diagram illustrating a configuration example of a semiconductor storage device according to a first embodiment.

Embodiments provide a semiconductor storage device capable of inhibiting a leakage current of a non-selected cell.

In general, according to one embodiment, a semiconductor storage device includes a plurality of first wirings extending in a first direction and a plurality of second wirings extending in a second direction intersecting the first direction. A plurality of memory cells are connected between the plurality of first wirings and the plurality of second wirings and include selectors each connected in series to variable resistance elements. Each of the selectors includes a selector material switching a current flowing to the variable resistance element according to a voltage difference between the first wiring and the second wiring, and first and second electrodes sandwiching the selector material in a portion between the first wiring and the variable resistance element. A contact area between the first electrode and the selector material is less than an area of the selector material when viewed in a stacking direction of the selector and the variable resistance element.

Hereinafter, embodiments of the present disclosure will be described with reference to the drawings. The embodiments are not limited to the present disclosure. The drawings are schematic and conceptual. In the present application and drawings, the same elements are denoted by the same reference numerals.

First Embodiment

FIG. 1 is a block diagram illustrating a configuration example of a semiconductor storage device according to a first embodiment. The semiconductor storage device according to the first embodiment is, for example, a magnetic storage device of a perpendicular magnetization type in which a magnetic tunnel junction (MTJ) element having a magnetoresistive effect is used as a variable resistance element, for example. The embodiment is also applicable to another variable resistance element such as a phase change memory (PCM). In the following description, a magnetic storage device will be described as an example of the semiconductor storage device.

A magnetic storage device 1 includes a memory cell array 10, a row selection circuit 11, a column selection circuit 12, a decoding circuit 13, a writing circuit 14, a reading circuit 15, a voltage generation circuit 16, an input/output circuit 17, and a control circuit 18.

The memory cell array 10 includes a plurality of memory cells MC at intersections of rows and columns. The memory cells MC in the same row are connected to the same word line WL, and the memory cells MC in the same column are connected to the same bit line BL.

The row selection circuit 11 is connected to the memory cell array 10 via the word lines WL. The row selection circuit 11 is supplied with a decoding result (row address) of an address ADD from the decoding circuit 13. The row selection circuit 11 sets a word line WL corresponding to a row which is based on the decoding result of the address ADD to a selected state. Hereinafter, the word line WL set to the selected state is referred to as a selected word line WL. A word line WL other than the selected word line WL is referred to as a non-selected word line WL.

The column selection circuit 12 is connected to the memory cell array 10 via the bit lines BL. The column selection circuit 12 is supplied with a decoding result (column address) of an address ADD from the decoding circuit 13. The column selection circuit 12 sets a column which is based on the decoding result of the address ADD to a selected state. Hereinafter, the bit line BL set to the selected state is referred to as a selected bit line BL. A bit line other than the selected bit line BL is referred to as a non-selected bit line BL.

The decoding circuit 13 decodes the address ADD from the input/output circuit 17. The decoding circuit 13 supplies a decoding result of the address ADD to the row selection circuit 11 and the column selection circuit 12. The address ADD includes a selected column address and row address.

The writing circuit 14 writes data in the memory cell MC. The writing circuit 14 includes, for example, a writing driver.

The reading circuit 15 reads data from the memory cell MC. The reading circuit 15 includes, for example, a sense amplifier.

The voltage generation circuit 16 generates voltages for various operations of the memory cell array 10 using a power voltage supplied from outside of the magnetic storage device 1. For example, the voltage generation circuit 16 generates various voltages necessary during a write operation and outputs the generated voltages to the writing circuit 14. For example, the voltage generation circuit 16 generates various voltages necessary during a read operation and outputs the generated voltages to the reading circuit 15.

The input/output circuit 17 transfers the address ADD from outside of the magnetic storage device 1 to the decoding circuit 13. The input/output circuit 17 transfers a command CMD from outside of the magnetic storage device 1 to the control circuit 18. The input/output circuit 17 transmits and receives various control signals CNT between outside of the magnetic storage device 1 and the control circuit 18. The input/output circuit 17 transfers data DAT from outside of the magnetic storage device 1 to the writing circuit 14 and outputs data DAT transferred from the reading circuit 15 to outside of the magnetic storage device 1.

Based on the control signals CNT and the command CMD, the control circuit 18 controls operations of the row selection circuit 11, the column selection circuit 12, the decoding circuit 13, the writing circuit 14, the reading circuit 15, the voltage generation circuit 16, and the input/output circuit 17 in the magnetic storage device 1.

Figure 2:
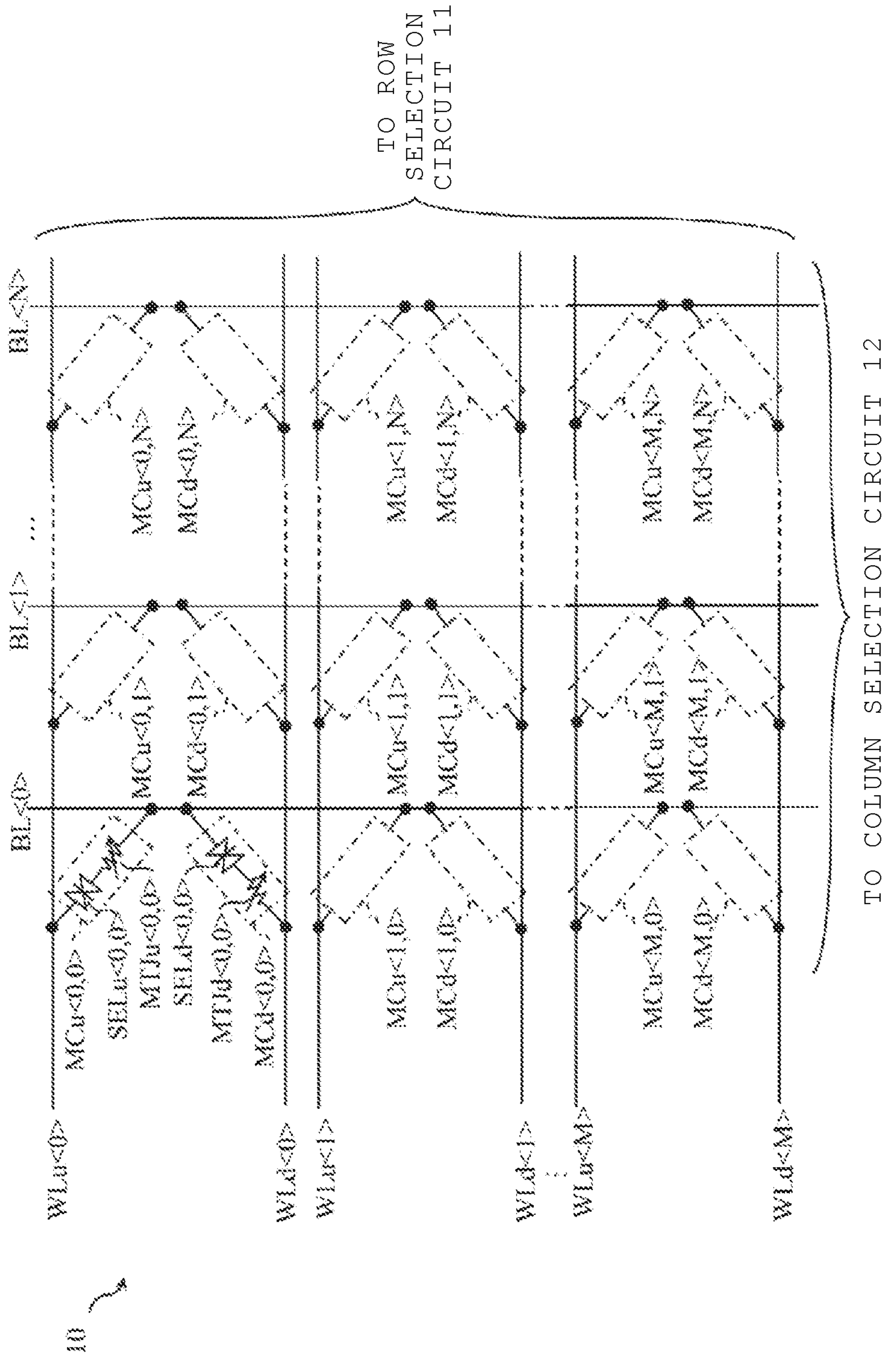
FIG. 2 is a circuit diagram illustrating a configuration of a memory cell array of the semiconductor storage device according to the first embodiment.

FIG. 2 is a circuit diagram illustrating a configuration of a memory cell array of the semiconductor storage device according to the first embodiment. The memory cells MC (MCu and MCd) are 2-dimensionally located in a matrix configuration in the memory cell array 10 and each correspond to an intersection of one bit line among a plurality of bit lines BL (BL<0>, BL<1>, . . . , and BL<N>) and one word line among a plurality of word lines WLd (WLd<0>, WLd<1>, . . . , WLd<M>), and WLu (WLu<0>, WLu<1>, . . . , WLu<M>) (where M and N are any integer). That is, a memory cell MCd<i, j> (where $0 \le i \le M$ and $0 \le j \le N$) is connected between a word line WLd<i> and a bit line BL<j>. A memory cell MCu<i, j> is connected between a word line WLu<i> and a bit line BL<j>. The word lines WLu and WLd intersect the bit line BL and are orthogonal to each other, for example. Hereinafter, the word lines WLu and WLd are collectively referred to as the word lines WL.

In WLd or the like, d indicates a configuration provided below the bit line BL for convenience. In WLu or the like, u indicates a configuration provided above the bit line BL for convenience.

The memory cell MCd<i, j> includes a selector SELd<i, j> and a magnetoresistive element MTJd<i, j> connected in series between the corresponding word line WL and bit line BL. The memory cell MCu<i, j> includes a selector SELu<i, j> and a magnetoresistive element MTJu<i, j> connected in series.

The selector SEL has a function of a switch that controls supply of a current flowing to the magnetoresistive element MTJ during writing and reading of data in and from the corresponding magnetoresistive element MTJ. For example, the selector SEL in a certain memory cell MC cuts off a current as an insulator having a large resistant value (enters an OFF state) when a voltage applied to the memory cell MC is lower than a threshold voltage Vth, and causes a current to flow as a conductor having a low resistant value (enters an ON state) when the voltage is higher than the threshold voltage Vth. That is, the selector SEL has a function of switching whether a current flows according to magnitude of a voltage difference (a voltage applied to the memory cell MC) between the corresponding word line WL and bit line BL regardless of a direction of the flowing current.

The magnetoresistive element MTJ can switch a resistive value thereof between a low resistance state and a high resistance state according to a current of which supply is controlled by the selector SEL. The magnetoresistive element MTJ functions as a memory element capable of writing data according to a change in the resistance state, latching written data in a nonvolatile manner, and reading data.

Next, a cross-sectional structure of the memory cell array 10 will be described.

Figure 3:
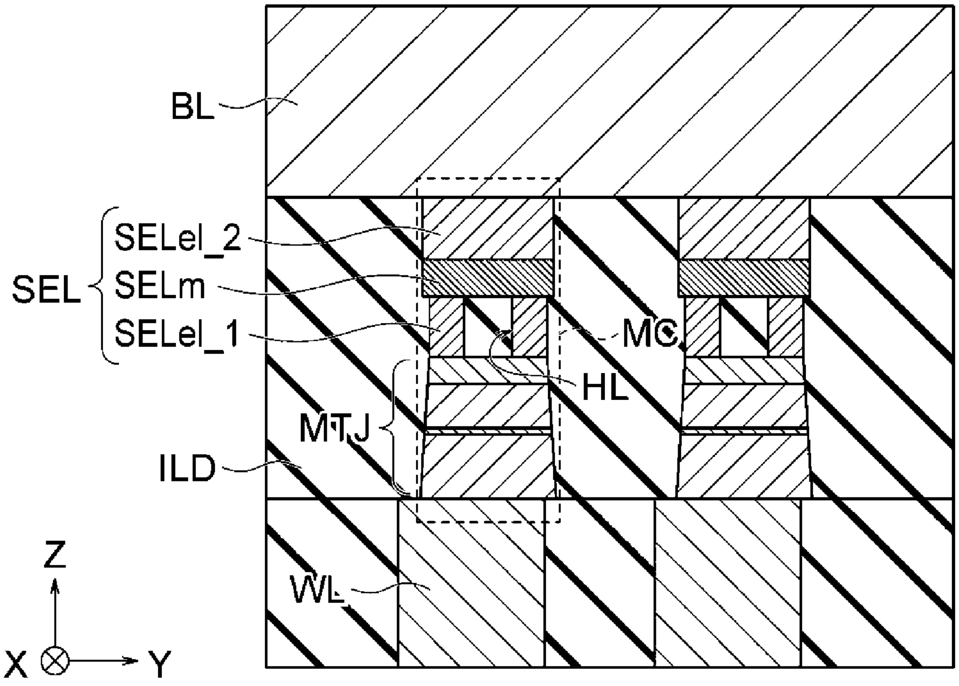
FIG. 3 is a sectional view illustrating a configuration of a memory cell of the semiconductor storage device according to the first embodiment.
Figure 4:
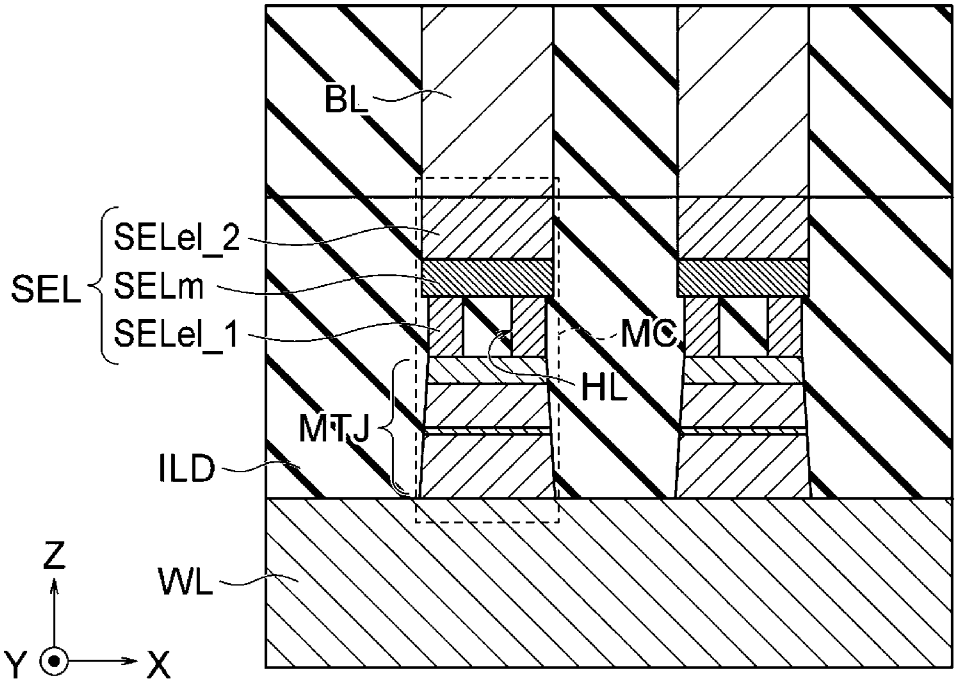
FIG. 4 is a sectional view illustrating a configuration of the memory cell of the semiconductor storage device according to the first embodiment.

FIGS. 3 and 4 are sectional views illustrating a configuration of the memory cell MC of the semiconductor storage device according to the first embodiment. FIG. 3 illustrates a cross-sectional surface in a direction of the bit line BL. FIG. 4 illustrates a cross-sectional surface in a direction of the word line WL. The memory cell MC may be any one of an MCu or an MCd.

The memory cell MC is provided above (Z direction) a semiconductor substrate (not illustrated). An extension direction of the word line WL is referred to as an X direction and an extension direction of the bit line BL is referred to as a Y direction. A perpendicular direction to an X-Y plane is referred to as a Z direction.

The plurality of word lines WL are provided on the semiconductor substrate. The plurality of word lines WL extend in the X direction and are arranged along the Y direction. The plurality of memory cells MC are provided on the plurality of word lines WL. The plurality of memory cells MC are located 2-dimensionally in the X-Y plane. The plurality of bit lines BL are provided on the plurality of memory cells MC. The plurality of bit lines BL extend in the Y direction and are arranged along the X direction. In the word lines WL and the bit lines BL, for example, a conductive material such as tungsten (W) or titanium nitride (TiN) is used. Interlayer insulating films ILD are provided between the plurality of word lines WL, between the plurality of memory cells MC, and between the plurality of bit lines BL. In the interlayer insulating film ILD, for example, an insulating material such as silicon oxide ($SiO_2$) is used.

Each memory cell MC includes the magnetoresistive element MTJ and the selector SEL. A configuration of the magnetoresistive element MTJ will be described below with reference to FIG. 6.

The selector SEL includes electrodes SELel_1 and SELel_2, and a selector material SELm. The selector material SELm is provided between the electrode SELel_1 and the electrode SELel_2. The electrode SELel_1 has, for example, a cylindrical shape. A through via hole HL is provided in a central portion of the electrode SELel_1 in the Z direction. In the electrode SELel_1 and the electrode SELel_2, for example, a conductive material such as titanium nitride (TiN) or tungsten nitride (WN) is used.

The selector SEL is configured such that the electrode SELel_1, the selector material SELm, and the electrode SELel_2 are stacked in the Z direction.

The selector material SELm is formed of an insulating material containing an additive element. As the insulating material of the selector material SELm, a silicon oxide containing silicon (Si) and oxygen (O) is used. As the additive element of the selector material SELm, arsenic (As), phosphorus (P), antimony (Sb), or boron (B) is used.

For example, the plurality of magnetoresistive elements MTJ are located in the X direction along the word lines WL and are located in the Y direction along the bit lines BL. Accordingly, the magnetoresistive elements MTJ are 2-dimensionally located in the X-Y plane. One end of each magnetoresistive element MTJ is connected to the bit line BL via at least one selector SEL. The other end of each magnetoresistive element MTJ is connected to the word line WL.

A plurality of 2-dimensional arrays of the memory cells MC illustrated in FIGS. 3 and 4 may be provided in the Z direction. Here, the 2-dimensional arrays of two memory cells MC are disposed with the bit line BL interposed therebetween to share the bit line BL. Accordingly, the plurality of memory cells MC may be located 3-dimensionally. Here, the memory cell array 10 has a structure corresponding to a set of two word lines WLd and WLu with respect to one bit line BL, as illustrated in FIG. 2. The memory cell array 10 includes memory cells MCd provided between the word lines WLd and the bit lines BL and the memory cells MCu provided between the bit lines BL and the word lines WLu. Of two memory cells MC commonly connected to one bit line BL, the memory cell MC provided in an upper layer of the bit line BL is MCu of FIG. 2 and the memory cell MC provided in a lower layer is MCd of FIG. 2.

Figure 5:
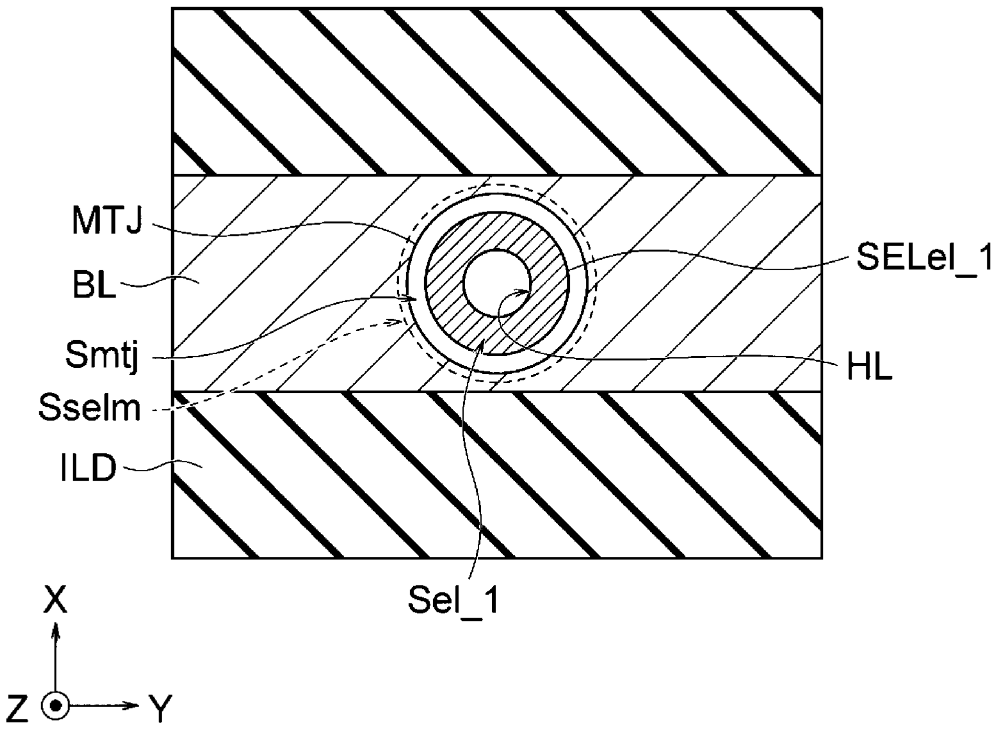
FIG. 5 is a plan view illustrating a configuration example of one magnetoresistive element and an electrode of a selector corresponding to the magnetoresistive element.

FIG. 5 is a plan view illustrating a configuration example of one magnetoresistive element MTJ and an electrode SELel_1 of the selector SEL corresponding to the magnetoresistive element MTJ. The electrode SELel_1 has a cylindrical shape having the through via hole HL at a central portion when the magnetoresistive element MTJ and the selector SEL are viewed in the stacking direction (Z direction). The electrode SELel_1 may have, for example, a substantially cylindrical shape or a substantially rectangular cylindrical shape. A contact area between the electrode SELel_1 and the magnetoresistive element MTJ is, for example, an area Sel_1 obtained by subtracting an inner area of the through via hole HL from an inner area of Selel_1 of FIG. 5. The area Sel_1 may be a contact area between the electrode SELel_1 and the selector material SELm of FIG. 3 or 4. The area Sel_1 may be a layout area of the electrode SELel_1 in a plan view when viewed in the Z direction.

The area Sel_1 of the electrode SELel_1 is less than an area Smtj of the magnetoresistive element MTJ when viewed in the Z direction. The area Smtj may be a layout area of the magnetoresistive element MTJ in a plan view when viewed in the Z direction.

The area Sel_1 of the electrode SELel_1 is less than an area Sselm of the selector material SELm when viewed in the Z direction. The area Sselm may be a layout area of the entire selector SEL in a plan view when viewed in the Z direction. The area Sel_1 of the electrode SELel_1 is an area obtained by excluding the area of the through via hole HL from the area Sselm.

As such, the area Sel_1 of the electrode SELel_1 is set to be less than the area Sselm of any selector material SELm. Accordingly, a resistant value of the electrode SELel_1 is raised, and thus it is possible to inhibit a current flowing in the selector material SELm. As a result, it is possible to reduce an off-leakage current of the selector SEL. The effect will be described below with reference to FIG. 7.

Figure 6:
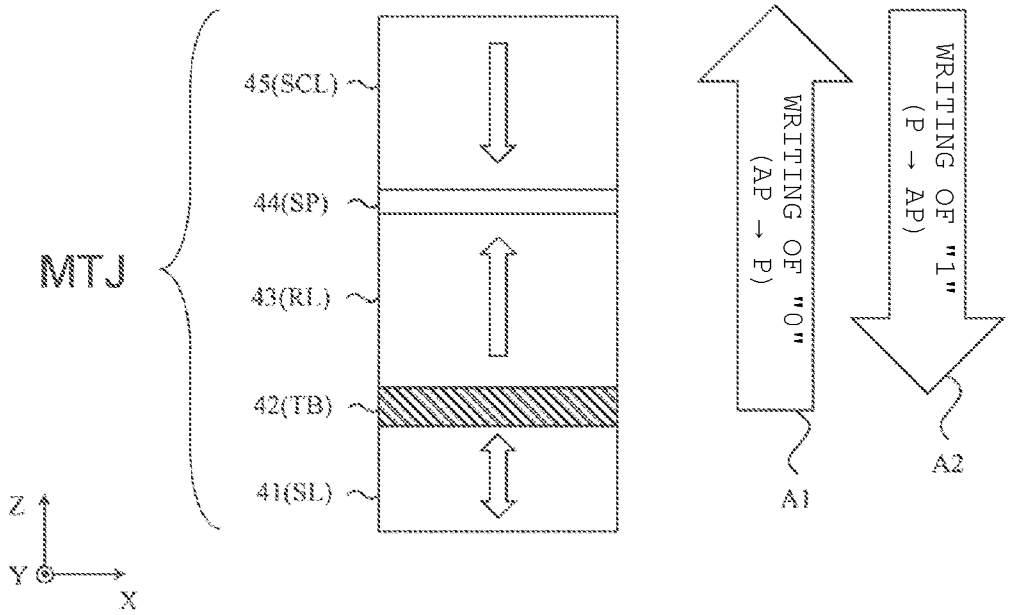
FIG. 6 is a sectional view illustrating a configuration example of one magnetoresistive element.

FIG. 6 is a sectional view illustrating a configuration example of one magnetoresistive element MTJ. The magnetoresistive element MTJ includes a ferromagnetic body 41 functioning as a storage layer SL, a non-magnetic body 42 functioning as a tunnel barrier layer TB, a ferromagnetic body 43 functioning as a reference layer RL, a non-magnetic body 44 functioning as a spacer layer SP, and a ferromagnetic body 45 functioning as a shift cancelling layer SCL.

In the magnetoresistive element MTJ, for example, a plurality of materials are stacked in the order of the ferromagnetic body 41, the non-magnetic body 42, the ferromagnetic body 43, the non-magnetic body 44, and the ferromagnetic body 45 in the Z direction from the word line WL to the bit line BL. The stacking order of the layers may be reverse. The magnetoresistive element MTJ functions as a perpendicular magnetization type MTJ element in which a magnetization direction of the magnetic bodies are oriented in the stacking direction (±Z direction).

The ferromagnetic body 41 has ferromagnetism and has an axis direction of easy magnetization in the ±Z direction. The ferromagnetic body 41 has a magnetization direction oriented in one direction of the bit line BL side or the word line WL side. The ferromagnetic body 41 includes, for example, cobalt iron boron (CoFeB) or iron boride (FeB) and may have a crystal structure of a body-centered cubic system.

The non-magnetic body 42 is a non-magnetic insulating film and includes, for example, magnesium oxide (MgO). The non-magnetic body 42 is provided between the ferromagnetic body 41 and the ferromagnetic body 43, and configures a magnetic tunnel junction between the two ferromagnetic bodies.

The ferromagnetic body 43 has ferromagnetism and has an axis direction of easy magnetization in the Z direction. The ferromagnetic body 43 includes, for example, cobalt iron boron (CoFeB) or iron boride (FeB). The magnetization direction of the ferromagnetic body 43 is fixed to be oriented in the direction of the ferromagnetic body 45 in the example of FIG. 6. "The magnetization direction is fixed" means that the magnetization direction is not changed according to a current (spin torque) with magnitude that may reverse the magnetization direction of the ferromagnetic body 41.

The ferromagnetic body 43 may be a stacked body formed by a plurality of layers. For example, the ferromagnetic body 43 may be a stacked structure of ferromagnetic bodies and non-magnetic conductors. The non-magnetic conductor of the ferromagnetic body 43 may include at least one metal selected from, for example, tantalum (Ta), hafnium (Hf), tungsten (W), zirconium (Zr), molybdenum (Mo), niobium (Nb), and titanium (Ti). The ferromagnetic body of the ferromagnetic body 43 may include at least one artificial lattice selected from a multilayer of cobalt (Co) and platinum (Pt) (Co/Pt multilayer film), a multilayer of cobalt (Co) and nickel (Ni) (Co/Ni multilayer film), and a multilayer of cobalt (Co) and palladium (Pd) (Co/Pd multilayer film).

The non-magnetic body 44 is a non-magnetic conductive film and includes at least one element selected from, for example, ruthenium (Ru), osmium (Os), iridium (Ir), vanadium (V), and chrome (Cr).

The ferromagnetic body 45 has ferromagnetism and has an axis direction of easy magnetization in the −Z direction. The ferromagnetic body 45 includes at least one alloy selected from cobalt platinum (CoPt), cobalt nickel (CoNi), and cobalt palladium (CoPd). The ferromagnetic body 45 may be a stacked body formed by a plurality of layers as in the ferromagnetic body 43. Here, the ferromagnetic body 45 may include at least one artificial lattice selected from a multilayer of cobalt (Co) and platinum (Pt) (Co/Pt multilayer film), a multilayer of cobalt (Co) and nickel (Ni) (Co/Ni multilayer film), and a multilayer of cobalt (Co) and palladium (Pd) (Co/Pd multilayer film).

The magnetization direction of the ferromagnetic body 45 is fixed to be oriented in the direction of the ferromagnetic body 43 in the example of FIG. 6.

The ferromagnetic bodies 43 and 45 are combined so that magnetization directions are antiparallel to each other. A combination structure of the ferromagnetic body 43, the non-magnetic body 44, and the ferromagnetic body 45 is referred to as a synthetic anti-ferromagnetic (SAF) structure. Accordingly, the ferromagnetic body 45 can offset an influence of a magnetic leakage field of the ferromagnetic body 43 on the magnetic direction of the ferromagnetic body 41. As a result, the ferromagnetic body 41 inhibits asymmetry of easy magnetization reversal. That is, a difficulty of reversal of the magnetization direction from one side to the other side is inhibited from being different from a difficulty of reversal of the magnetization direction from the other side to one side.

In the first embodiment, a spin injection write system is adopted for causing a write current to directly flow to the magnetoresistive element MTJ, injecting a spin torque to the storage layer SL and the reference layer RL with the write current, and controlling a magnetization direction of the storage layer SL and a magnetization direction of the reference layer RL. The magnetoresistive element MTJ may enter either a low resistance state or a high resistance state according to whether a relative relation between the magnetization directions of the storage layer SL and the reference layer RL is parallel or antiparallel.

When a write current Iw0 flows to the magnetoresistive element MTJ in a direction of an arrow A1, that is, a direction oriented from the storage layer SL to the reference layer RL, the relative relation of the magnetization directions of the storage layer SL and the reference layer RL is parallel. In the parallel state, the resistant value of the magnetoresistive element MTJ is relatively low and the magnetoresistive element MTJ is set to the low resistance state. The low resistance state is referred to as a parallel (P) state and is defined as, for example, a state of data of 0.

When a write current Iw1 higher than the write current Iw0 flows to the magnetoresistive element MTJ in a direction of an arrow A2 opposite to the arrow A1, the relative relation of the magnetization directions of the storage layer SL and the reference layer RL is antiparallel. In the antiparallel state, the resistant value of the magnetoresistive element MTJ is relatively high and the magnetoresistive element MTJ is set to the high resistance state. The high resistance state is referred to as an antiparallel (AP) state and is defined as, for example, a state of data of 1. The P state may be defined as the data of 1 and the AP state may be defined as the data of 0.

Figure 7:
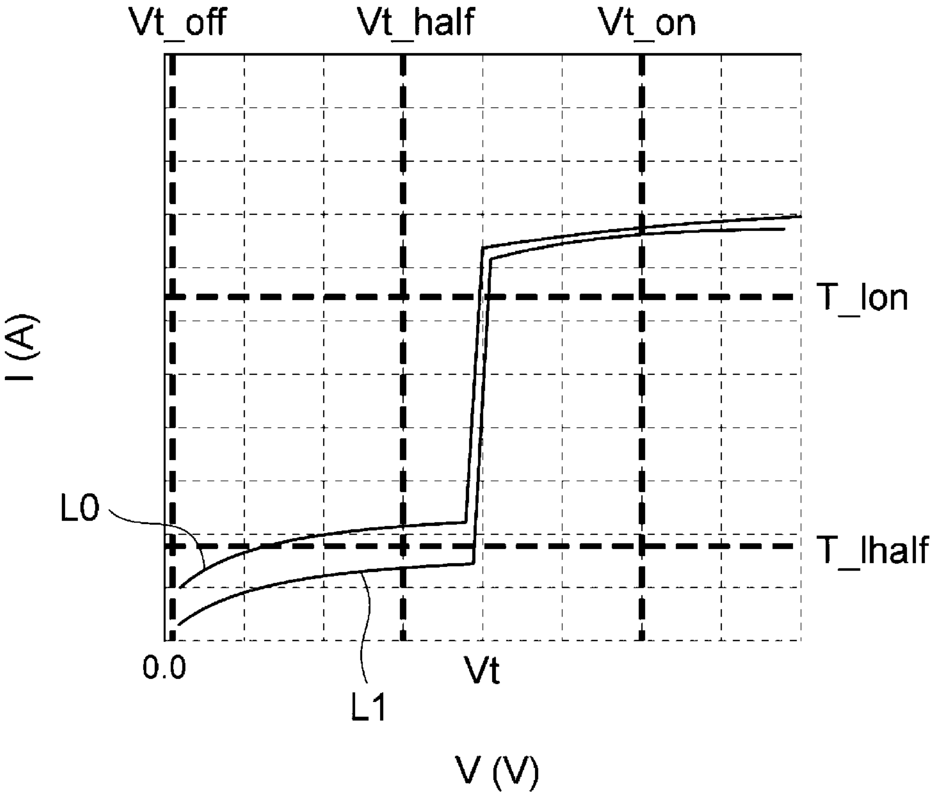
FIG. 7 is a graph illustrating characteristics of the selector.

FIG. 7 is a graph illustrating characteristics of the selector SEL. The vertical axis represents a current I flowing in the selector SEL logarithmically. The horizontal axis represents a voltage difference V between the electrode SELel_1 and the electrode SELel_2. A line L0 represents characteristics when the area Sel_1 of the electrode SELel_1 is the same as or greater than the area Sselm of the selector material SELm according to a comparative example. A line L1 represents characteristics of the selector SEL according to the embodiment. The line L1 represents characteristics when the area Sel_1 of the electrode SELel_1 is the same as or greater than Sselm.

The selector SEL switches a current flowing between the electrode SELel_1 and the electrode SELel_2 at a threshold voltage Vt. That is, the selector SEL causes the current to flow less when the current is lower than the threshold voltage Vt, and causes the current to flow more when the current is higher than the threshold voltage Vt.

For example, a large voltage difference (for example, Vt_on) is applied to the memory cell MC (selected cell) connected to the selected word line WL and the selected bit line BL. Here, the selector SEL causes a relatively large current to flow in the selected cell (ON state). Conversely, a relatively small voltage difference (for example, Vt_off) is applied to the memory cell MC (non-selected cell) connected to the non-selected word line WL and the non-selected bit line BL. Here, the selector SEL causes a current to flow less to the non-selected cell (OFF state).

On the other hand, there are a non-selected memory cell in a half-selected state connected to the selected word line WL and the non-selected bit line BL and a non-selected memory cell in a half-selected state connected to the non-selected word line WL and the selected bit line BL (half-selected cell). An intermediate voltage difference (for example, Vt_half) between the ON state and the OFF state is applied to the half-selected cell despite that the half-selected cell is the non-selected memory cell. Here, the half-selected cell does not enter the ON state, but the off-leakage current becomes higher than that of the non-selected cell. The off-leakage current is a current flowing in the non-selected cell or the half-selected cell.

Here, T_Ion is a lower limit of the ON current of the memory cell MC and T_Ihalf is an upper limit of the off-leakage current of the half-selected memory. Here, the ON current of the selected cell is required to be T_Ion or more and the off-leakage current of the half-selected cell is required to be less than T_Ihalf.

In the line L0 according to the comparative example, the ON current of the selected cell is T_Ion or more. However, the off-leakage current of the half-selected cell at the intermediate voltage difference Vt_half is greater than T_Ihalf.

On the other hand, in the line L1 according to the embodiment, the ON current of the selected cell is maintained to be T_Ion or more and the off-leakage current of the half-selected cell at the intermediate voltage difference Vt_half is decreased to a current less than T_Ihalf. It is because the area Sel_1 of the selector SEL (a contact area between the electrode SELel_1 and the selector material SELm) according to the embodiment is less than the area Sselm of the selector material SELm in a plan view when viewed in the Z direction, and therefore the electrode SELel_1 inhibits the off-leakage current.

As such, according to the embodiment, since the electrode SELel_1 is formed with a cylindrical shape having a through via hole in a direction in which a current flows (the stacking direction of the magnetoresistive element MTJ and the selector SEL), the area Sel_1 of the electrode SELel_1 can be made less than the area Sselm of the selector material SELm. By causing the area Sel_1 of the electrode SELel_1 to be less than the area Sselm of the selector material SELm, it is possible to maintain the off-leakage current of the half-selected cell to a current less than the upper limit T_Ihalf.

By the electrode SELel_1 being formed in the cylindrical shape, a surface area of the electrode SELel_1 increases. Accordingly, the electrode SELel_1 easily dissipates heat of the selector SEL.

Next, a manufacturing method for the magnetic storage device 1 according to the embodiment will be described.

FIGS. 8A to 18B are sectional views illustrating an example of a manufacturing method for the semiconductor storage device according to the first embodiment. FIGS. 8A, 9A, 10A, 11A, 12A, 13A, 14A, 15A, 16A, 17A, and 18A illustrate cross-sectional surfaces along the extension direction (Y direction) of the bit line BL. FIGS. 8B, 9B, 10B, 11B, 12B, 13B, 14B, 15B, 16B, 17B, and 18B illustrate cross-sectional surfaces along the extension direction (X direction) of the word line WL.

First, the plurality of word lines WL are formed above a substrate (not illustrated).

Subsequently, a material of the magnetoresistive element MTJ is stacked on the word line WL. For example, materials of the ferromagnetic body 41, the non-magnetic body 42, the ferromagnetic body 43, the non-magnetic body 44, and the ferromagnetic body 45 in FIG. 6 are stacked in this order. The non-magnetic body 44 and the ferromagnetic body 45 are illustrated as one layer.

Subsequently, materials of hard masks HM1 and HM2 are deposited on the material of the magnetoresistive element MTJ. For example, carbon (C) is used for the hard mask HM1. For example, amorphous silicon is used for the hard mask HM2.

Figure 8A:
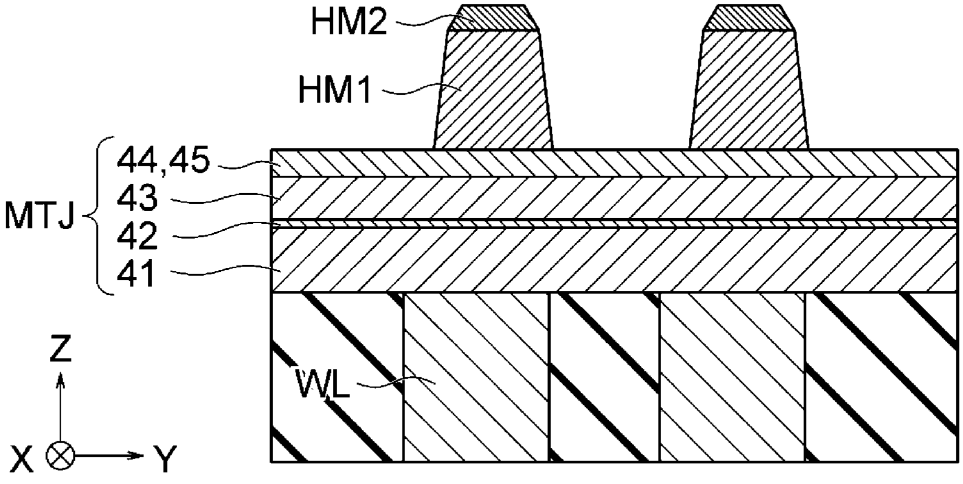
FIGS. 8A and 8B are sectional views illustrating an example of a manufacturing method for the semiconductor storage device according to the first embodiment.
Figure 8B:
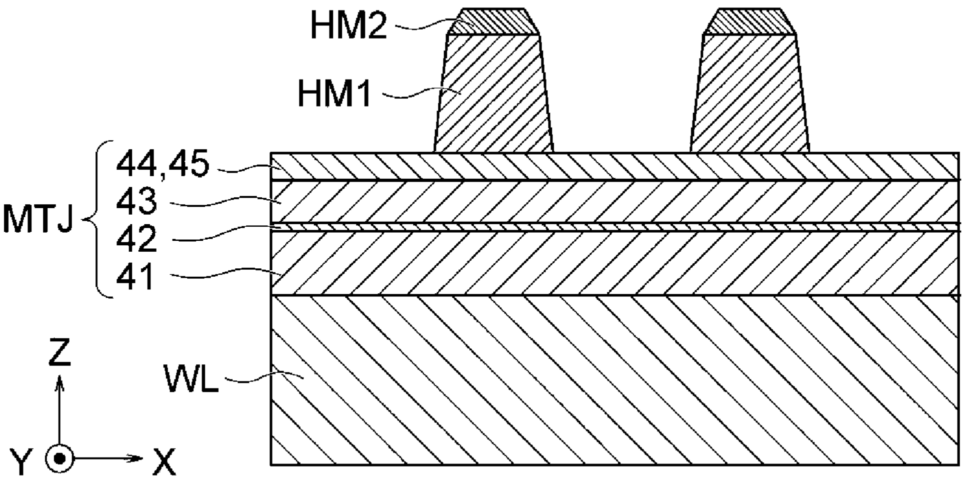
Figure 9A:
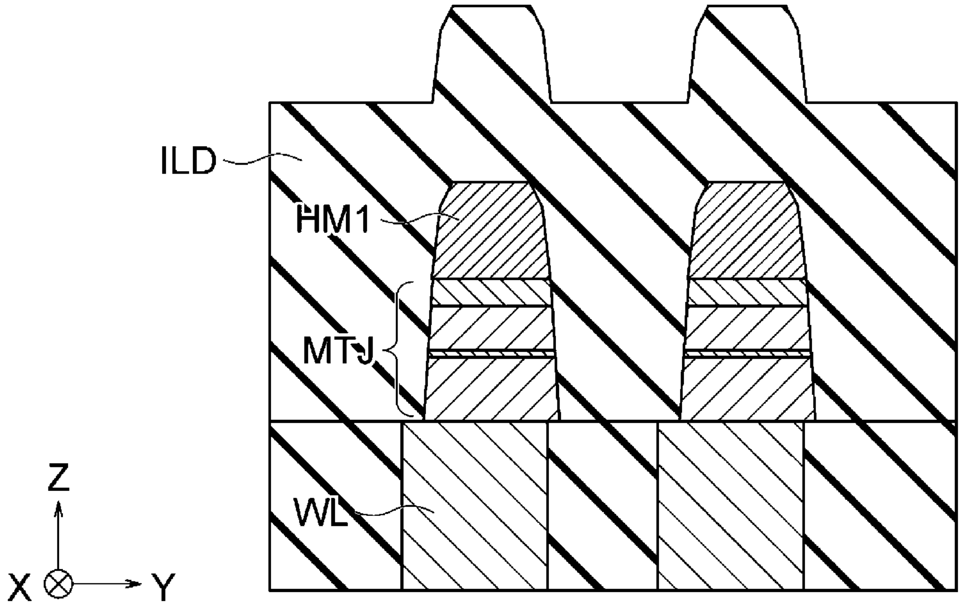
FIG. 9A is a sectional view illustrating an example of the manufacturing method after FIG. 8A.
Figure 9B:
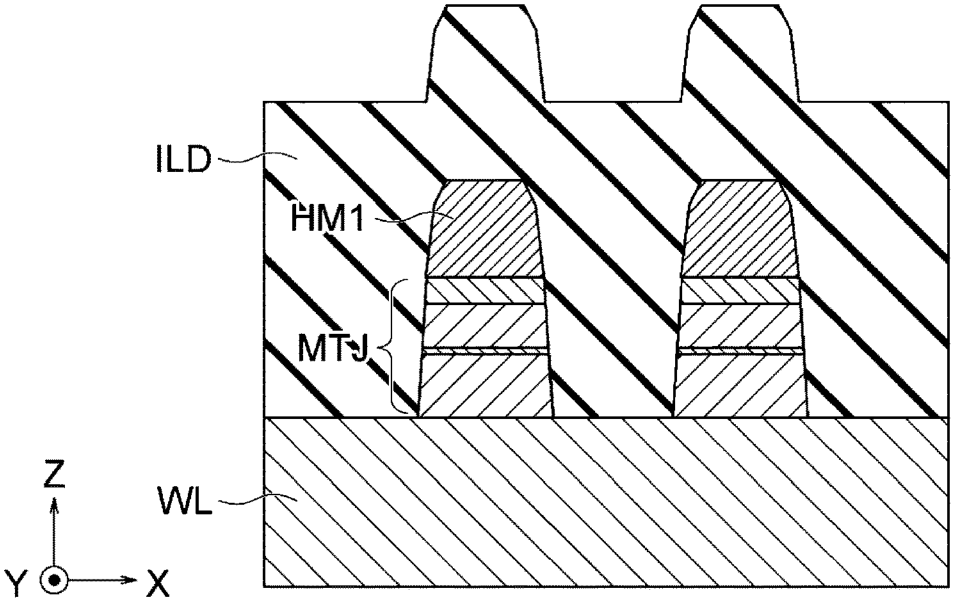
FIG. 9B is a sectional view illustrating an example of the manufacturing method after FIG. 8B.

The hard mask HM2 is processed to a layout pattern of the magnetoresistive element MTJ using a lithographic technology and an etching technology. Subsequently, the hard mask HM1 is processed using the hard mask HM2 as a mask. Accordingly, as illustrated in FIGS. 8A and 8B, the hard masks HM1 and HM2 are processed to the layout pattern of the magnetoresistive element MTJ.

Subsequently, the material of the magnetoresistive element MTJ is processed by an ion beam etching (IBE) method or the like using the hard mask HM1 as a mask. Accordingly, the magnetoresistive element MTJ is formed on the word line WL. Subsequently, the magnetoresistive element MTJ and the hard mask HM1 are covered with a material of the interlayer insulating film ILD. The material of the interlayer insulating film ILD is buried between the adjacent magnetoresistive elements MTJ and between the adjacent hard masks HM1. Accordingly, the structure illustrated in FIGS. 9A and 9B can be obtained.

Figure 10A:
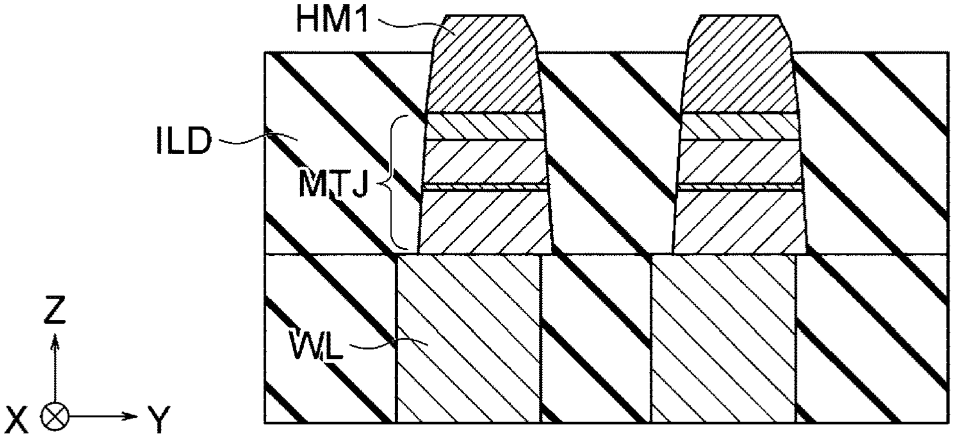
FIG. 10A is a sectional view illustrating an example of the manufacturing method after FIG. 9A.
Figure 10B:
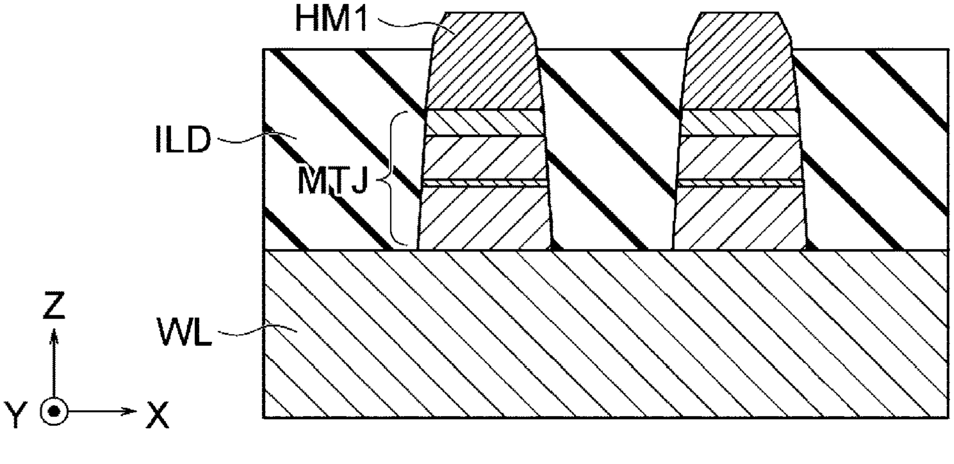
FIG. 10B is a sectional view illustrating an example of the manufacturing method after FIG. 9B.

Subsequently, as illustrated in FIGS. 10A and 10B, the material of the interlayer insulating film ILD is planarized by a chemical mechanical polishing (CMP) method or the like, is etched back to expose the surface of the hard mask HM1. Here, the upper surface of the interlayer insulating film ILD is maintained at a position higher than the upper surface of the magnetoresistive element MTJ.

Figure 11A:
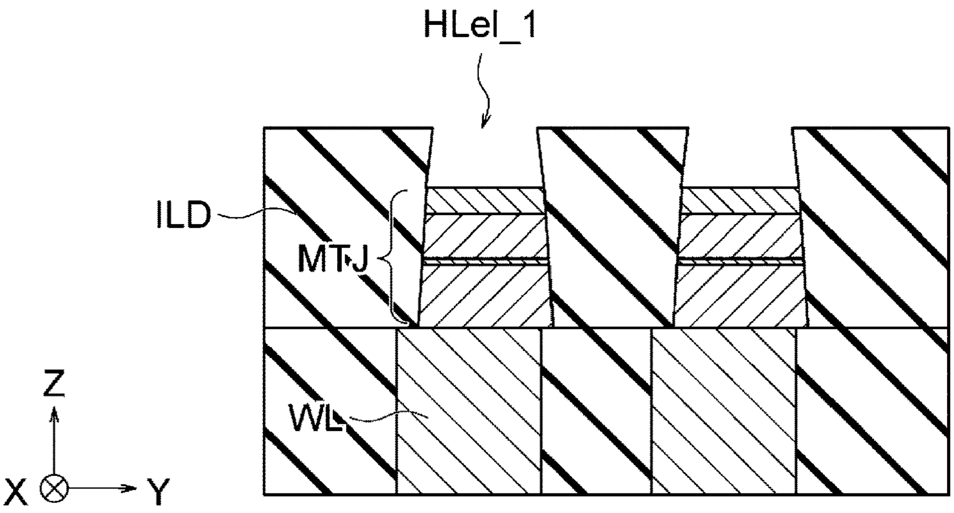
FIG. 11A is a sectional view illustrating an example of the manufacturing method after FIG. 10A.
Figure 11B:
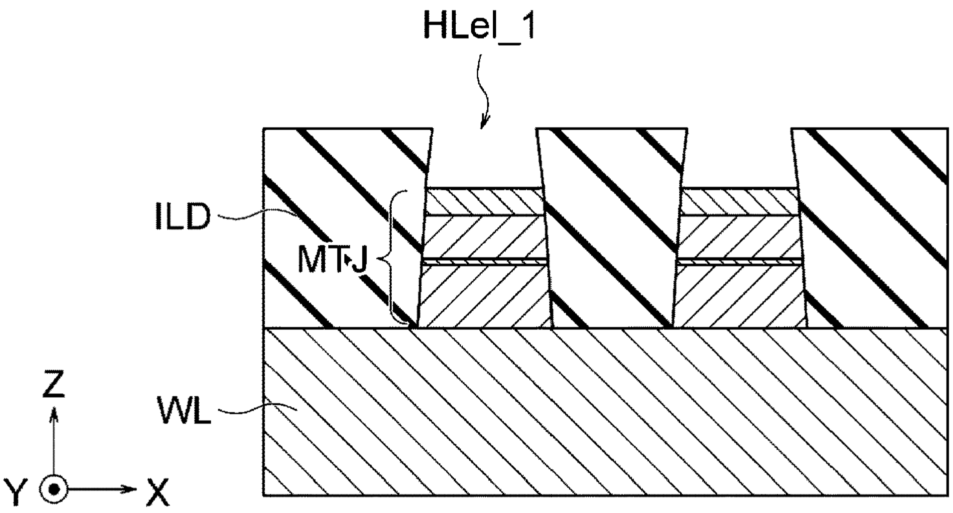
FIG. 11B is a sectional view illustrating an example of the manufacturing method after FIG. 10B.

Subsequently, as illustrated in FIGS. 11A and 11B, ashing is performed on the hard mask HM1 to selectively remove the hard mask HM1. Accordingly, the hard mask HM1 on the magnetoresistive element MTJ is removed and a through via hole HLel_1 surrounded by side walls of the interlayer insulating film ILD is formed on the magnetoresistive element MTJ.

Figure 12A:
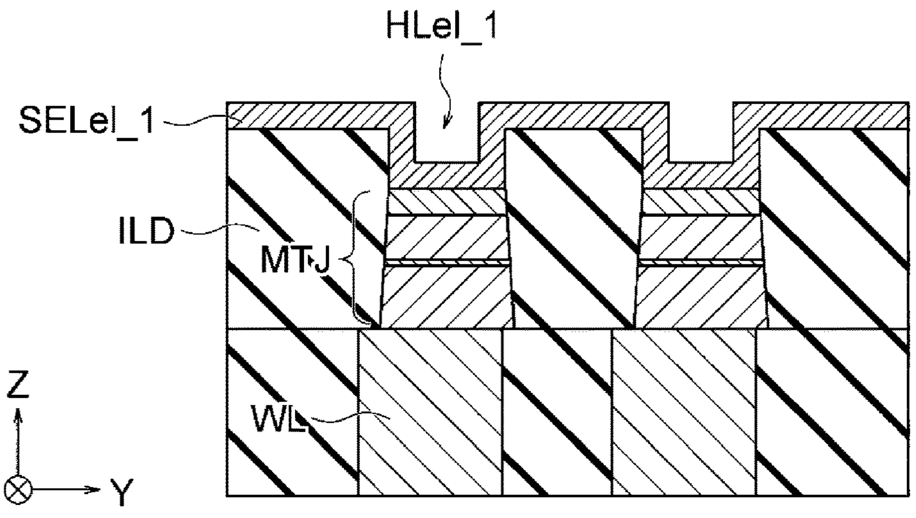
FIG. 12A is a sectional view illustrating an example of the manufacturing method after FIG. 11A.
Figure 12B:
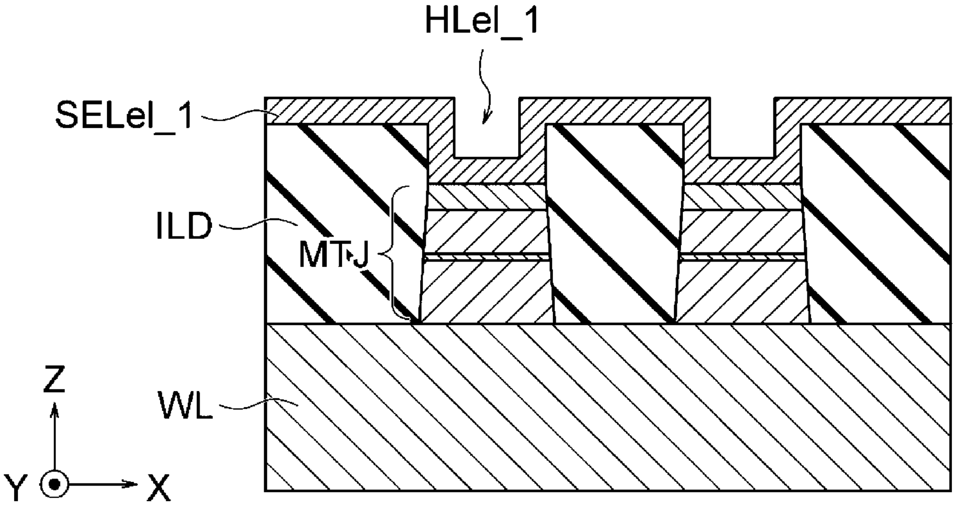
FIG. 12B is a sectional view illustrating an example of the manufacturing method after FIG. 11B.

Subsequently, a material (for example, TiN) of the electrode SELel_1 is deposited on the inner wall of the through via hole HLel_1 and the interlayer insulating film ILD using an atomic layer deposition (ALD) method or the like. Accordingly, as illustrated in FIGS. 12A and 12B, a material of the electrode SELel_1 is formed on the bottom surface (on the MTJ) and the inner wall of the through via hole HLel_1.

Figure 13A:
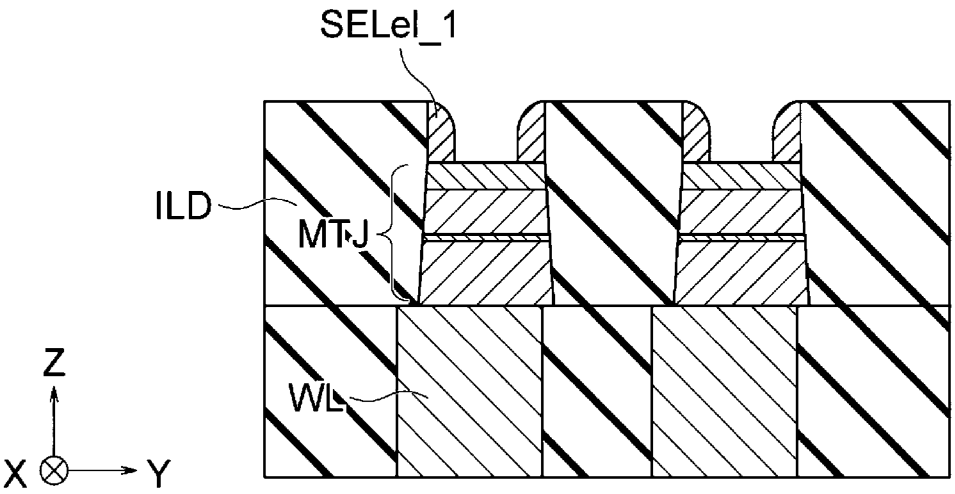
FIG. 13A is a sectional view illustrating an example of the manufacturing method after FIG. 12A.
Figure 13B:
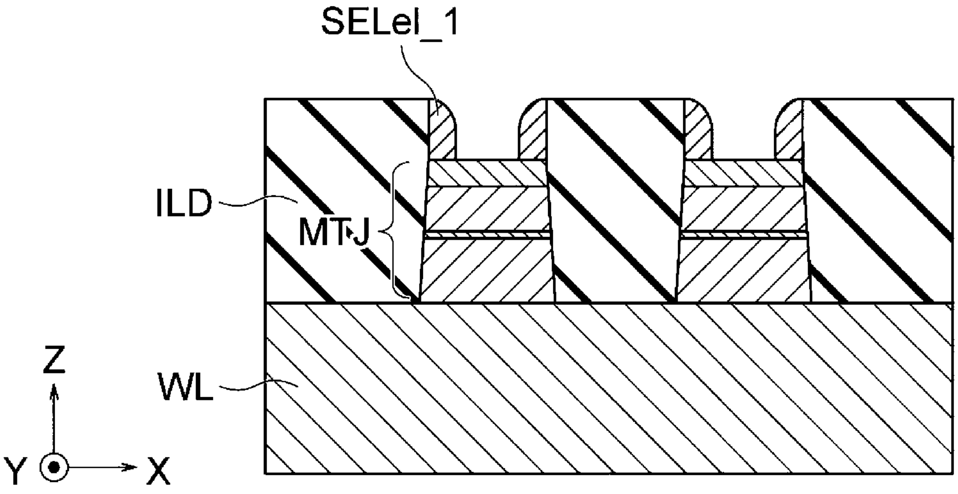
FIG. 13B is a sectional view illustrating an example of the manufacturing method after FIG. 12B.

Subsequently, the material of the electrode SELel_1 is anisotropically etched back using a reactive ion etching (RIE) method or the like. Accordingly, as illustrated in FIGS. 13A and 13B, the materials of the electrode SELel_1 is left along the inner wall of the through via hole HLel_1. The electrode SELel_1 is left in a cylindrical shape along the outer edge of the upper surface of each magnetoresistive element MTJ.

Figure 14A:
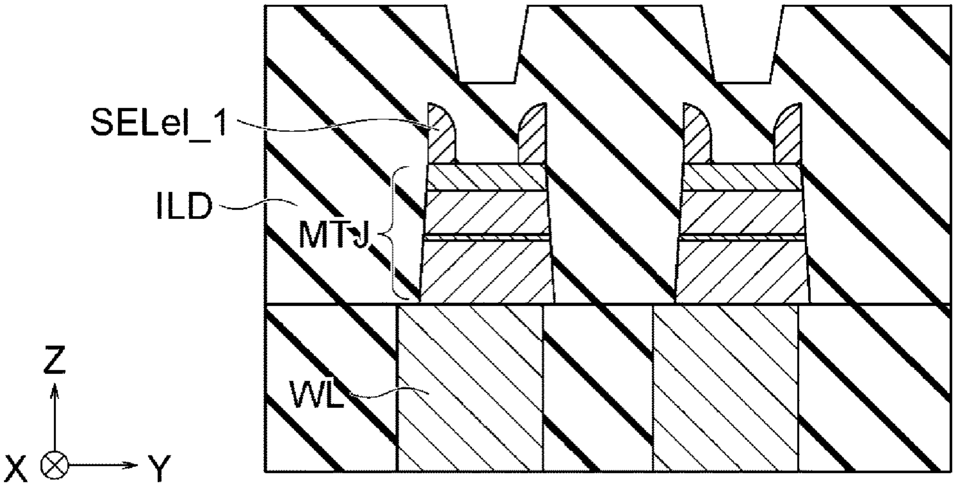
FIG. 14A is a sectional view illustrating an example of the manufacturing method after FIG. 13A.
Figure 14B:
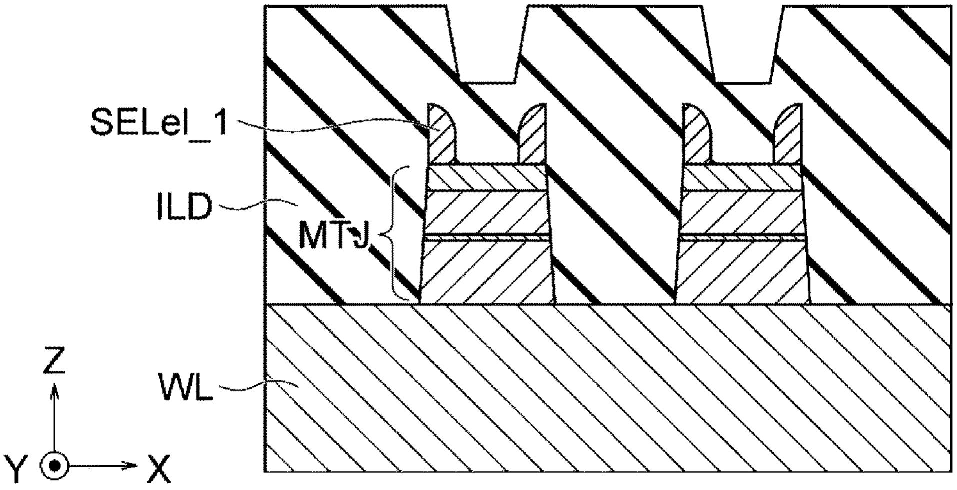
FIG. 14B is a sectional view illustrating an example of the manufacturing method after FIG. 13B.

Subsequently, as illustrated in FIGS. 14A and 14B, the interlayer insulating film ILD is deposited to bury the electrode SELel_1.

Figure 15A:
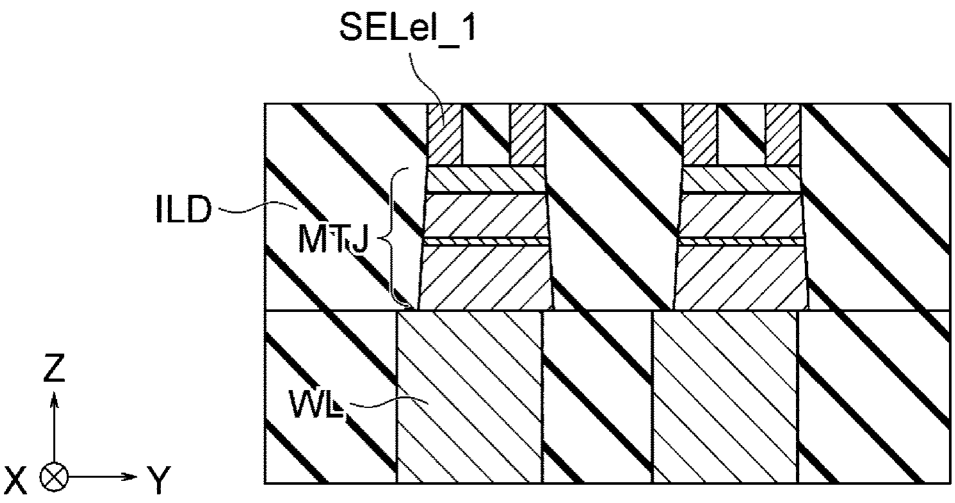
FIG. 15A is a sectional view illustrating an example of the manufacturing method after FIG. 14A.
Figure 15B:
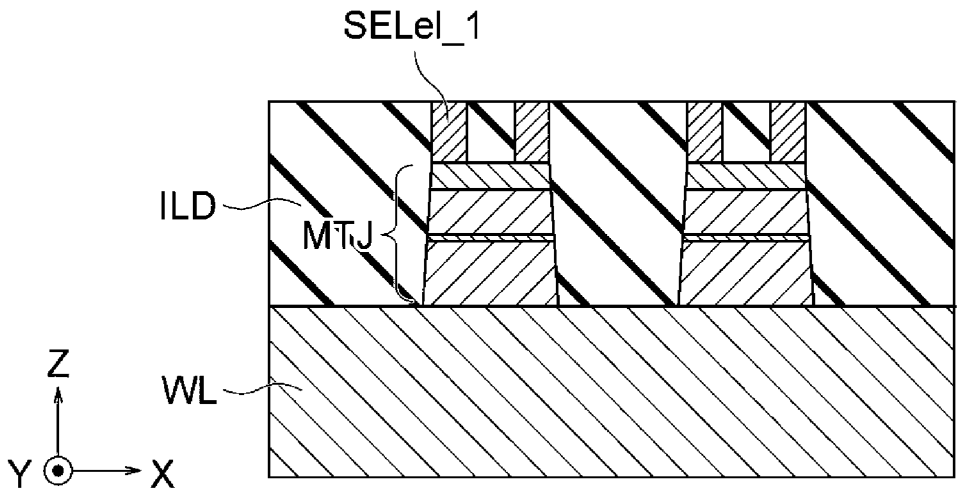
FIG. 15B is a sectional view illustrating an example of the manufacturing method after FIG. 14B.

Subsequently, planarization is performed using a CMP method or the like until the upper surface of the electrode SELel_1 is exposed. Accordingly, as illustrated in FIGS. 15A and 15B, the upper surface of the electrode SELel_1 is planarized so that the electrode SELel_1 is formed in the cylindrical shape. The material of the interlayer insulating film ILD is buried in the cylinder of the electrode SELel_1.

Subsequently, the selector material SELm and the material of the electrode SELel_2 are deposited on the electrode SELel_1 and the interlayer insulating film ILD. Subsequently, materials of the hard marks HM3 and HM4 are deposited on the material of the electrode SELel_2. For example, carbon (C) is used for the hard mask HM3. For example, polysilicon is used for the hard mask HM4. For example, metal such as titanium nitride (TiN) or tungsten (W) may be used for the hard mask HM3. For example, carbon (C) may be used for the hard mask HM4. When the hard mask HM3 is formed of metal such as titanium nitride (TiN) or tungsten (W), the hard mask HM3 can be used in an electric junction portion with an upper wiring BL without being removed after the selector material SELm is processed.

Figure 16A:
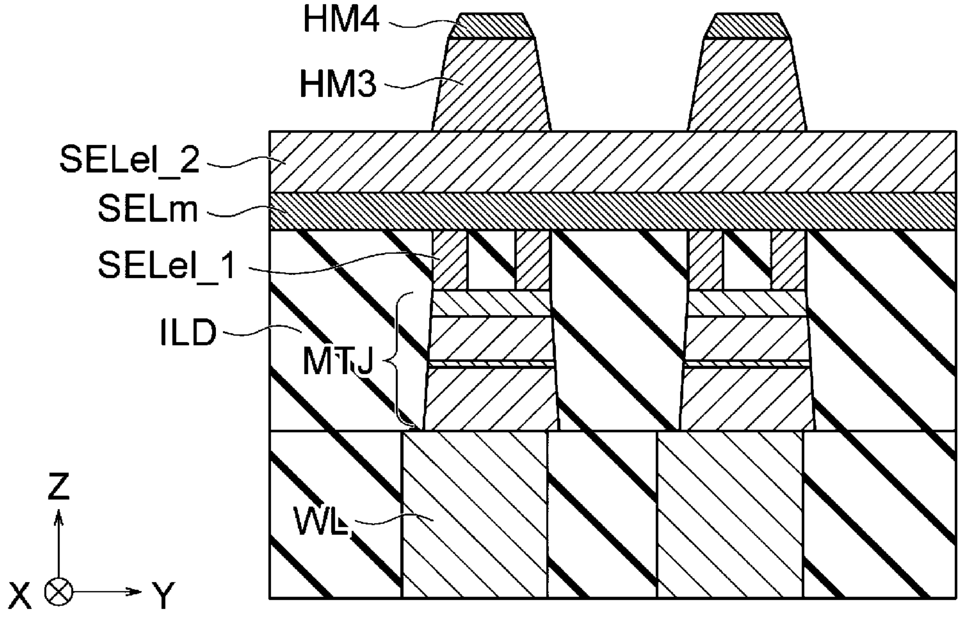
FIG. 16A is a sectional view illustrating an example of the manufacturing method after FIG. 15A.
Figure 16B:
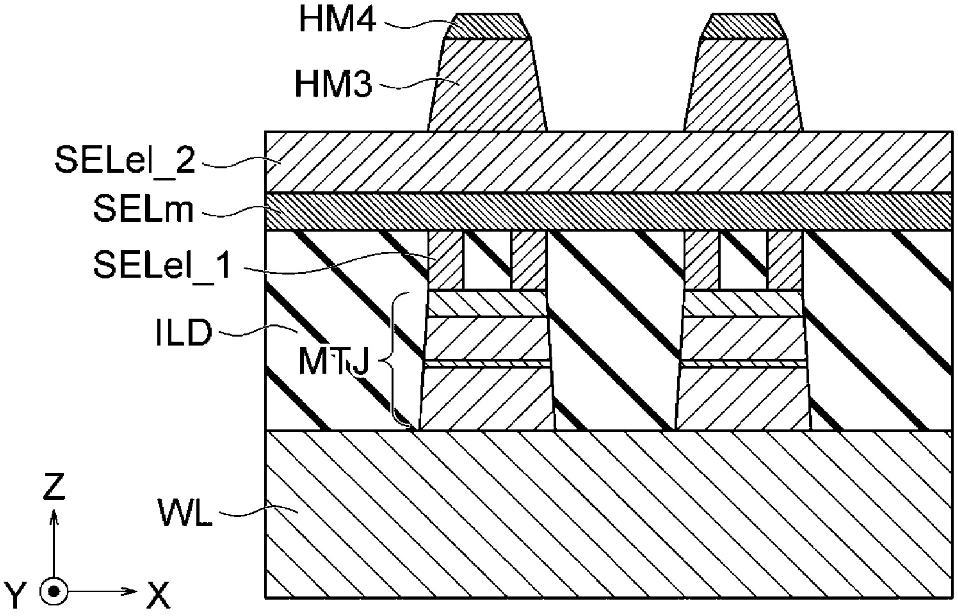
FIG. 16B is a sectional view illustrating an example of the manufacturing method after FIG. 15B.

Subsequently, the material of the hard mask HM4 is processed to a pattern of the selector SEL using a lithographic technology and an etching technology. Subsequently, the material of the hard mask HM3 is etched using the hard mask HM4 as a mask. Accordingly, as illustrated in FIGS. 16A and 16B, the hard masks HM3 and HM4 are processed to the pattern of the selector SEL.

Figure 17A:
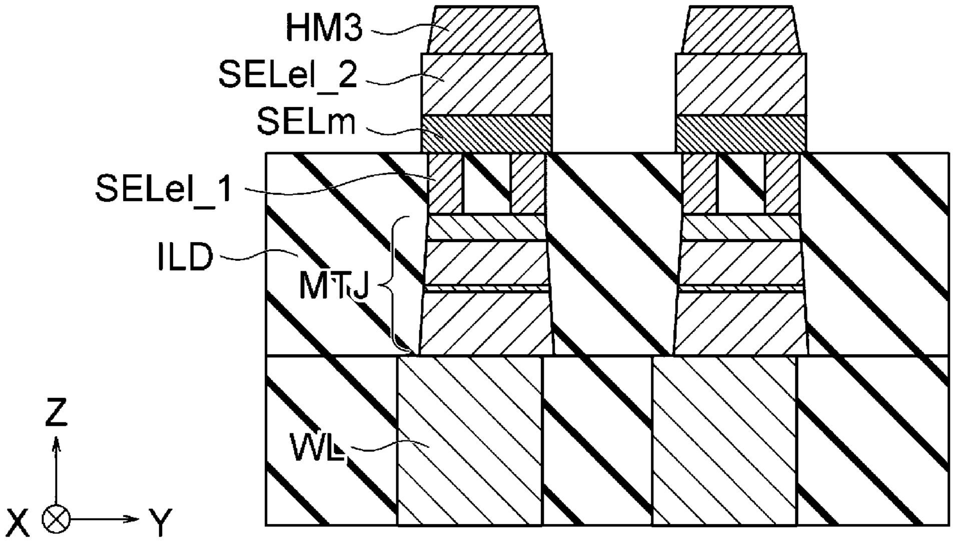
FIG. 17A is a sectional view illustrating an example of the manufacturing method after FIG. 16A.
Figure 17B:
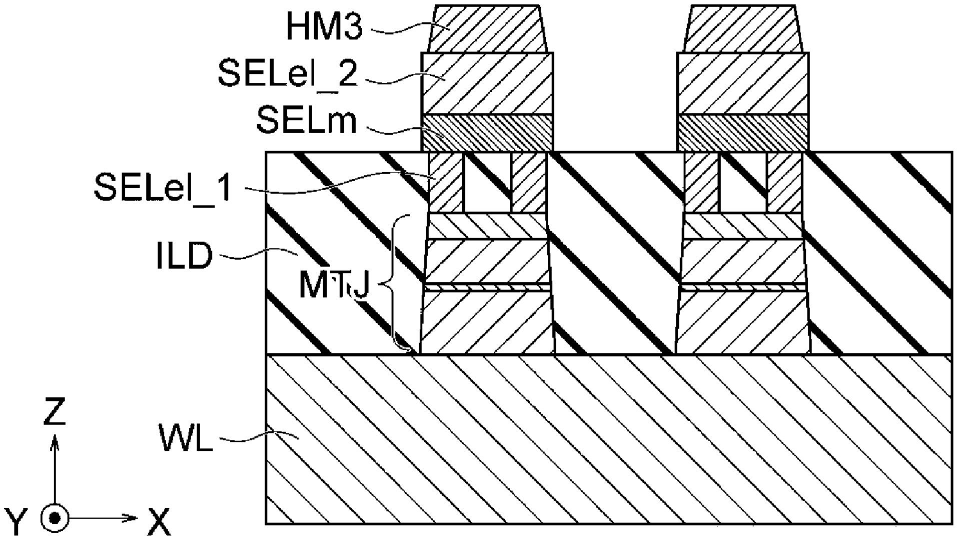
FIG. 17B is a sectional view illustrating an example of the manufacturing method after FIG. 16B.

Subsequently, as illustrated in FIGS. 17A and 17B, the material of the electrode SELel_2 and the material of the selector material SELm are etched using the hard mask HM3 as a mask. Accordingly, the electrode SELel_2 and the selector material SELm are formed on the electrode SELel_1.

Figure 18A:
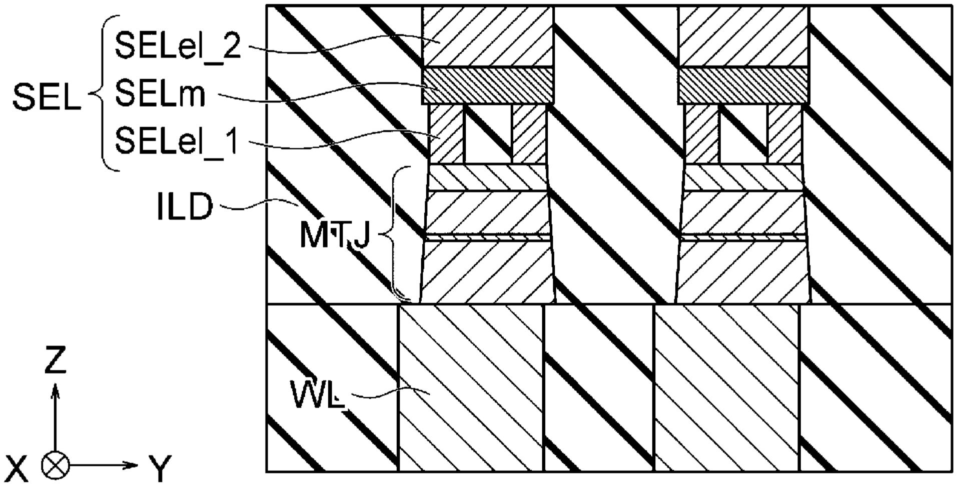
FIG. 18A is a sectional view illustrating an example of the manufacturing method after FIG. 17A.
Figure 18B:
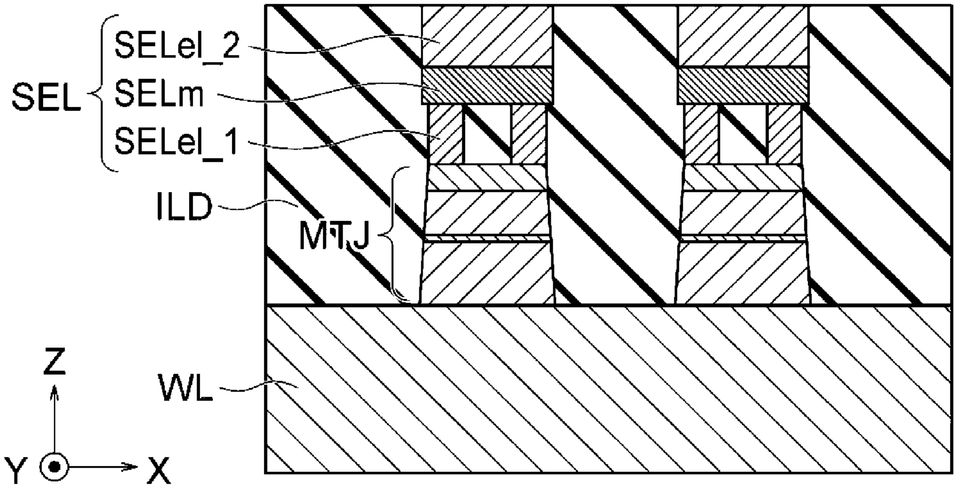
FIG. 18B is a sectional view illustrating an example of the manufacturing method after FIG. 17B.

Subsequently, the hard mask HM3 is buried with the material of the interlayer insulating film ILD. Subsequently, planarization is performed using a CMP method or the like until the upper surface of the electrode SELel_2 is exposed. Accordingly, as illustrated in FIGS. 18A and 18B, the hard mask HM3 is removed and the selector SEL is formed.

Thereafter, the magnetic storage device 1 illustrated in FIGS. 3 and 4 is completed by forming the bit line BL on the electrode SELel_2.

As such, according to the embodiment, the electrode SELel_1 is formed in the cylindrical shape using the side wall of the interlayer insulating film ILD.

According to the embodiment, since the electrode SELel_1 is formed in the cylindrical shape having the through via hole, the area Sel_1 of the electrode SELel_1 can be made less than the area Sselm of the selector material SELm. Accordingly, it is possible to reduce the off-leakage current of the half-selected cell.

When the electrode SELel_1 is formed in the cylindrical shape, the surface area of the electrode SELel_1 increases. Accordingly, the electrode SELel_1 easily dissipates heat of the selector SEL.

Modification 1

Figure 19:
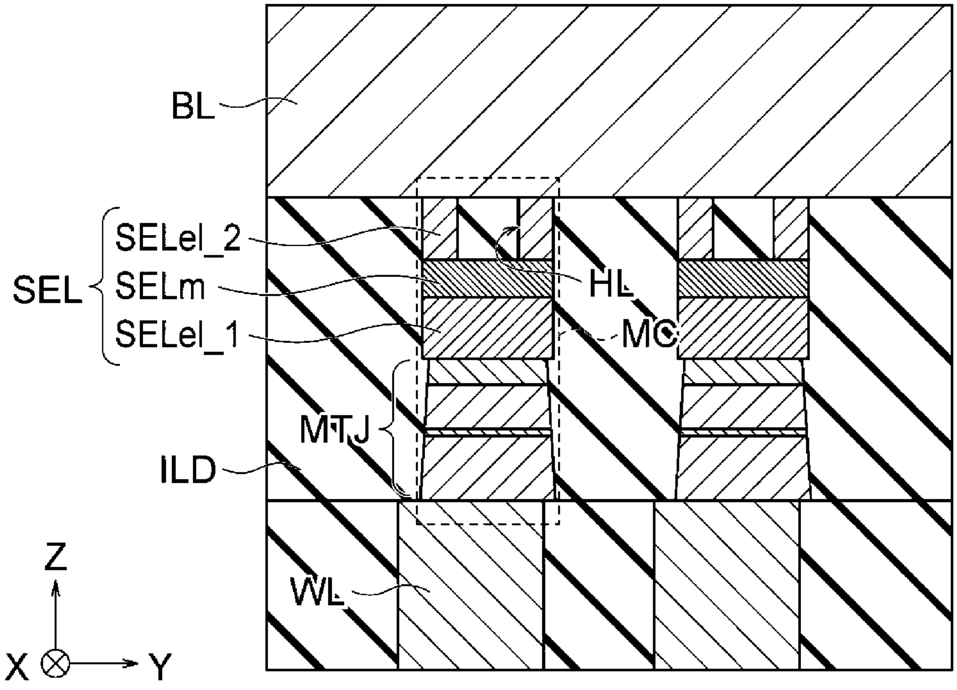
FIG. 19 is a sectional view illustrating a configuration example of a semiconductor storage device according to Modification 1 of the first embodiment.
Figure 20:
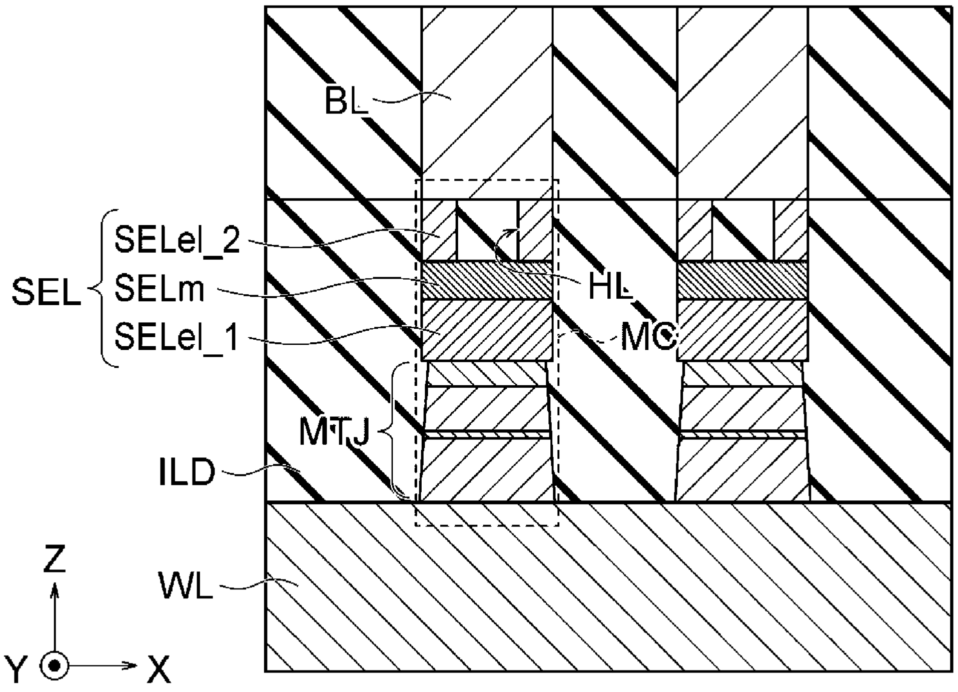
FIG. 20 is a sectional view illustrating a configuration example of the semiconductor storage device according to Modification 1 of the first embodiment.

FIGS. 19 and 20 are sectional views illustrating a configuration example of a semiconductor storage device according to Modification 1 of the first embodiment. FIG. 19 corresponds to FIG. 3 and FIG. 20 corresponds to FIG. 4.

In the first embodiment, the contact area between the electrode SELel_1 and the selector material SELm is set to be less than the area Sselm of the selector material SELm. However, as in Modification 1, a contact area between the electrode SELel_2 and the selector material SELm (hereinafter also referred to as an area Sel_2) may be set to be less than the area Sselm of the selector material SELm. Here, instead of the electrode SELel_1, the electrode SELel_2 may be formed in a cylindrical shape. Even then, the effect of the embodiment is not lost.

To form the electrode SELel_2 in the cylindrical shape, the hard masks HM3 and HM4 illustrated in FIGS. 16A and 16B are formed before the depositing of the material of the electrode SELel_2 and a through via hole is formed in the interlayer insulating film ILD as in the hard masks HM1 and HM2 according to the first embodiment illustrated in FIGS. 8A to 11B. As in the processes described with reference to FIGS. 12A to 15B, the material of the electrode SELel_2 is left on the side wall of the through via hole of the interlayer insulating film ILD and the left material is planarized. Accordingly, the electrode SELel_2 can be formed in the cylindrical shape as in the electrode SELel_1 according to the first embodiment.

Modification 2

Figure 21:
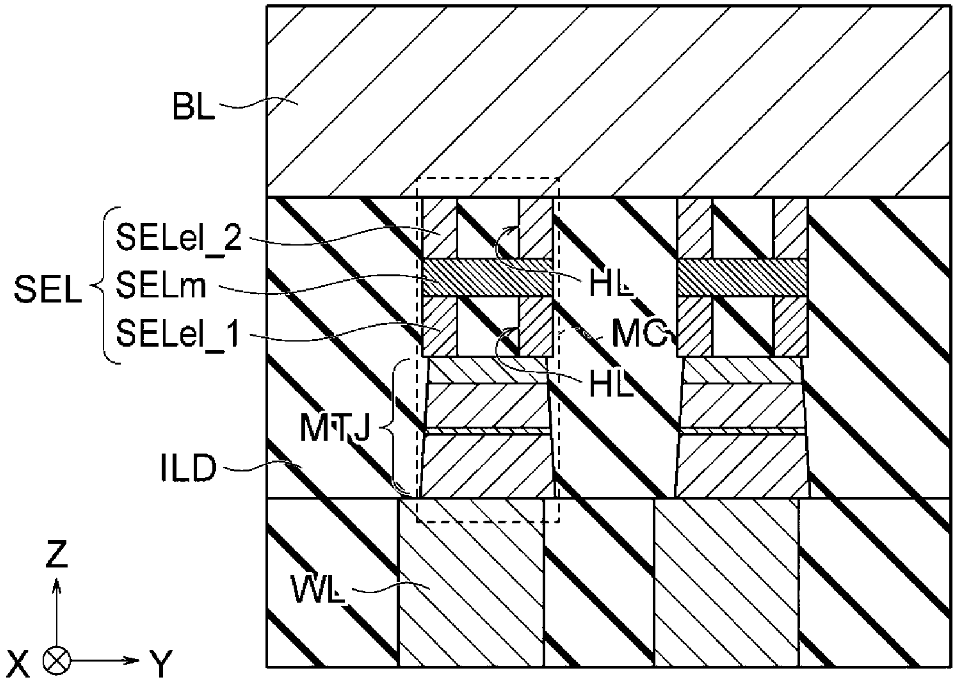
FIG. 21 is a sectional view illustrating a configuration example of a semiconductor storage device according to Modification 2 of the first embodiment.
Figure 22:
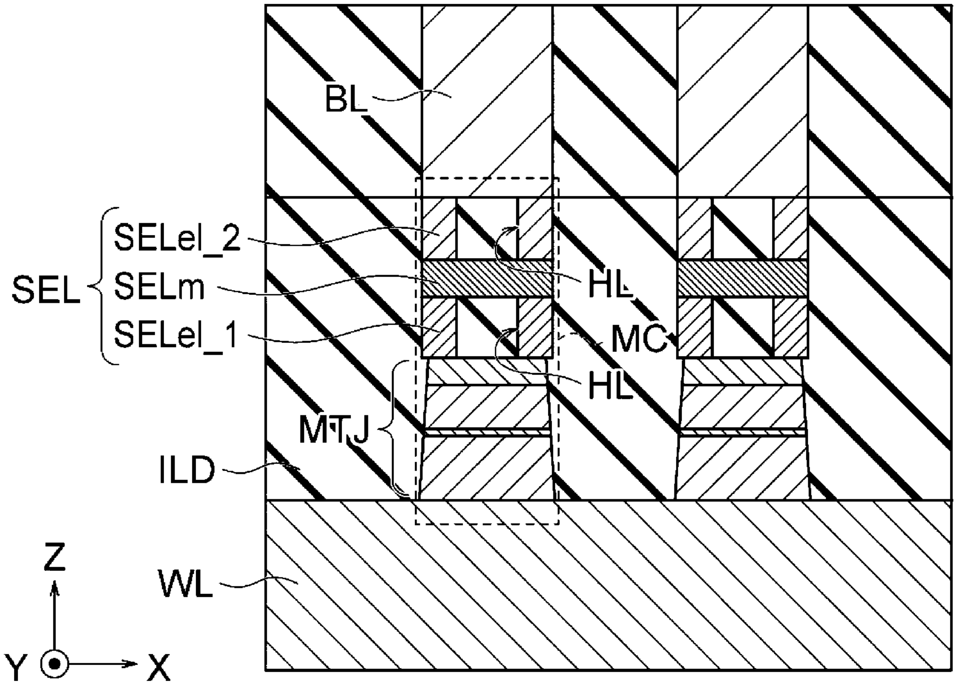
FIG. 22 is a sectional view illustrating a configuration example of the semiconductor storage device according to Modification 2 of the first embodiment.

FIGS. 21 and 22 are sectional views illustrating a configuration example of a semiconductor storage device according to Modification 2 of the first embodiment. FIG. 21 corresponds to FIG. 3 and FIG. 22 corresponds to FIG. 4.

In Modification 2, both the areas Sel_1 and Sel_2 are set to be less than the area Sselm of the selector material SELm. Here, as in the electrode SELel_1, the electrode SELel_2 may be formed in a cylindrical shape. Even then, the effect of the embodiment is not lost.

In Modification 2, a heat dissipation effect is enhanced since the surface areas of the electrodes SELel_1 and SELel_2 increase. Accordingly, it is possible to improve electric characteristics of the selector SEL such as a reduction in the off-leakage current of the selector SEL. It is possible to expect an effect of improving data retention characteristics of the magnetoresistive element MTJ.

Second Embodiment

FIGS. 23 to 30 are sectional views illustrating a configuration example of a selector SEL according to a second embodiment. A configuration of the electrode SELel_2 illustrated in FIGS. 23 and 28 may be applied to the electrode SELel_1.

Figure 23:
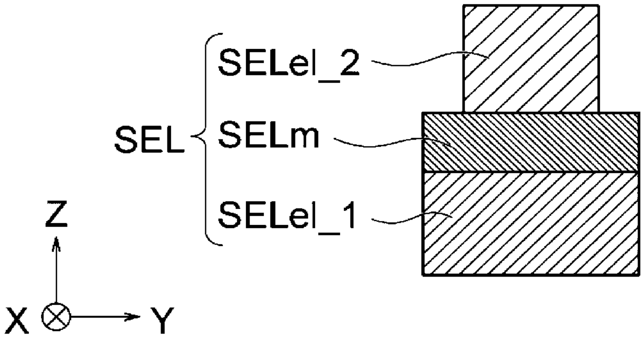
FIGS. 23-30 are sectional views illustrating a configuration example of a selector according to a second embodiment.

In FIG. 23, slimming is performed on the side surface of the electrode SELel_2 in the X-Y directions. In a plan view when viewed in the Z direction, a diameter of the electrode SELel_2 is less than a diameter of the selector material SELm. Even in such configuration, the area Sel_2 of the electrode SELel_2 is less than the area Sselm of the selector material SELm. Accordingly, in a plan view when viewed in the Z direction, the contact area between the selector material SELm and the electrode SELel_2 is less than the area of the selector material SELm.

Figure 24:
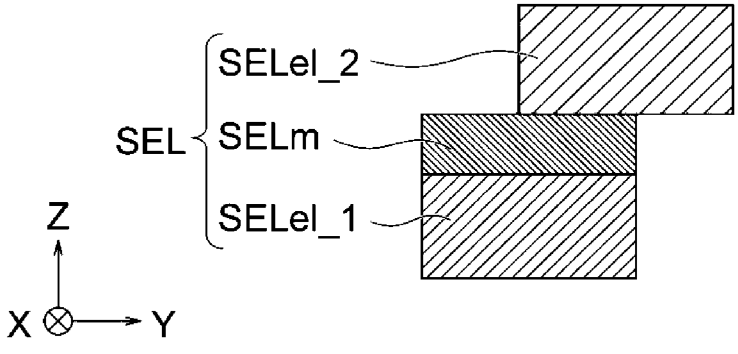

In FIG. 24, the electrode SELel_2 deviates from the center of the selector material SELm on an X-Y plane. In a plan view when viewed in the Z direction, the area of the electrode SELel_2 may be the same as or greater than the area of the selector material SELm. Since the electrode SELel_2 deviates from the center of the selector material SELm, the contact area between the selector material SELm and the electrode SELel_2 substantially decreases. Accordingly, even in such configuration, in a plan view when viewed in the Z direction, the contact area between the selector material SELm and the electrode SELel_2 can be set to be less than the area of the selector material SELm.

Figure 25:
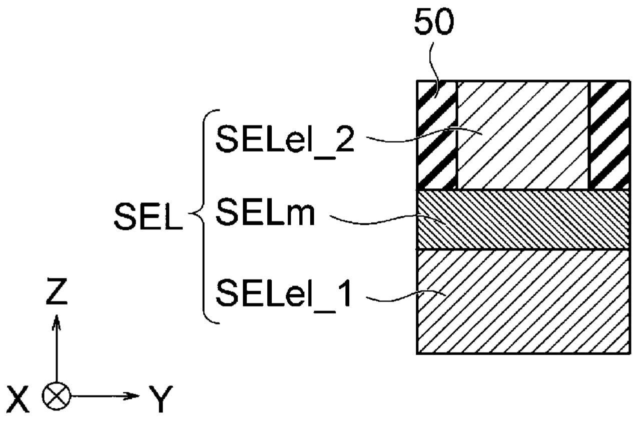

In FIG. 25, oxygen is introduced into the outer circumference of the electrode SELel_2. Oxygen may be introduced from the side wall of the electrode SELel_2 in an implanting process. Accordingly, a high resistant film 50 configured with an oxide film of the material of the electrode SELel_2 is provided in the outer circumference of the electrode SELel_2. The high resistant film 50 is a film that has higher resistance than a central portion of the electrode SELel_2. The high resistant film 50 is formed in a cylindrical shape in the outer circumference of the electrode SELel_2. Accordingly, the area Sel_2 in a conductive region of the electrode SELel_2 substantially decreases. Even in such configuration, in a plan view when viewed in the Z direction, the contact area between the selector material SELm and the electrode SELel_2 can be set to be less than the area of the selector material SELm.

Figure 26:
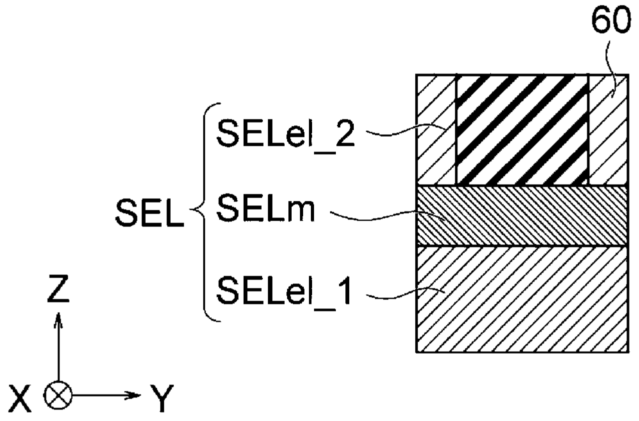

In FIG. 26, an impurity is introduced into the outer circumference of the electrode SELel_2. The material of the electrode SELel_2 is formed of, for example, silicon (Si). The impurity may be introduced from the side wall of the electrode SELel_2 in the implanting process. For example, boron (B) is used as the impurity. Accordingly, a low resistant film 60 that has lower resistance than the material of the electrode SELel_2 is provided in the outer circumference of the electrode SELel_2. The low resistant film 60 is a film that has lower resistance the central portion of the electrode SELel_2. The low resistant film 60 is formed in a cylindrical shape in the outer circumference of the electrode SELel_2. Even in such configuration, the area Sel_2 of the electrode SELel_2 can be set to be substantially less than the area Sselm of the selector material SELm. Accordingly, in a plan view when viewed in the Z direction, the contact area between the selector material SELm and the electrode SELel_2 can be set to be less than the area of the selector material SELm.

Figure 27:
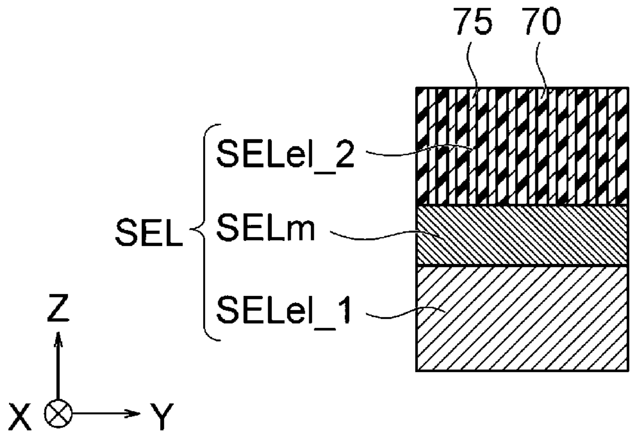

In FIG. 27, the electrode SELel_2 includes a plurality of conductive lines 75 provided in an insulator 70. The conductive lines 75 may be conductive lines (for example, aluminum) formed by directed self-assembly (DSA). The conductive lines 75 may be conductor pillars or conductive lines extracted in a eutectic mixture. Here, for example, aluminum (Al) may be extracted from a liquid in which aluminum is contained in silicon. Alternatively, aluminum in silicon may be located in a pillar shape or a line shape by baking powder in which aluminum is contained in silicon at a high temperature.

The conductive lines 75 may be a carbon nanotube or a conduction bridge. Even in such configuration, the area Sel_2 of the electrode SELel_2 can be set to be substantially less than the area Sselm of the selector material SELm. Accordingly, in a plan view when viewed in the Z direction, the contact area between the selector material SELm and the electrode SELel_2 can be set to be less than the area of the selector material SELm.

Figure 28:
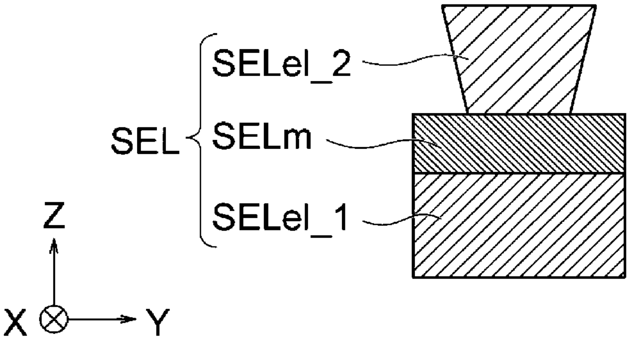

In FIG. 28, as in FIG. 23, slimming is performed on the side surface of the electrode SELel_2 in the X-Y directions. However, the side wall of the electrode SELel_2 in FIG. 28 is formed in an inverted taper shape. Accordingly, in a plan view when viewed in the Z direction, even when the area of the upper surface of the electrode SELel_2 is large, the contact area (Sel_2) between the electrode SELel_2 and the selector material SELm can be set to be sufficiently less than the area of the selector material SELm. Even in such configuration, the area Sel_2 of the electrode SELel_2 can be set to be less than the area Sselm of the selector material SELm. Accordingly, in a plan view when viewed in the Z direction, the contact area between the selector material SELm and the electrode SELel_2 can be set to be less than the area of the selector material SELm.

Figure 29:
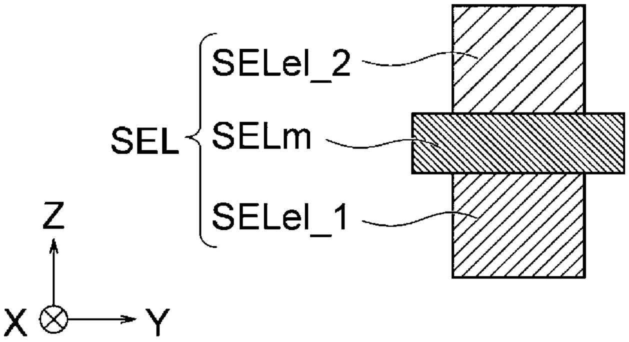

In FIG. 29, slimming is performed on the side surfaces of both the electrodes SELel_1 and SELel_2 in the X-Y directions. In a plan view when viewed in the Z direction, the diameters of both the electrodes SELel_1 and SELel_2 are less than the diameter of the selector material SELm. In such configuration, both the areas Sel_1 and Sel_2 of the electrodes SELel_1 and SELel_2 can be set to be less than the area Sselm of the selector material SELm. Accordingly, in a plan view when viewed in the Z direction, the contact area between the selector material SELm and the electrode SELel_2 can be set to be less than the area of the selector material SELm. The contact area between the selector material SELm and the electrode SELel_1 can also be set to be less than the area of the selector material SELm.

Figure 30:
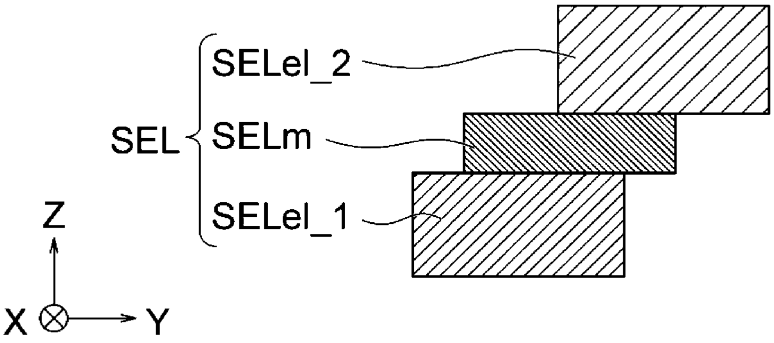

In FIG. 30, in a plan view when viewed in the Z direction, the electrodes SELel_1 and SELel_2 deviate from the center of the selector material SELm on an X-Y plane. The area of each of the electrodes SELel_1 and SELel_2 may be greater than the area of the selector material SELm. When the electrodes SELel_1 and SELel_2 deviate from the center of the selector material SELm in the X-Y directions, the area Sel_1 between the selector material SELm and the electrode SELel_1 and the area Sel_2 between the selector material SELm and the electrode SELel_2 substantially decrease. Accordingly, even in such configuration, in a plan view when viewed in the Z direction, the contact area between the selector material SELm and the electrode SELel_2 can be set to be less than the area of the selector material SELm. The contact area between the selector material SELm and the electrode SELel_1 can also be set to be less than the area of the selector material SELm.

The electrodes SELel_1 and SELel_2 deviate from the center of the selector material SELm in mutually opposite directions. Accordingly, a distance between the electrodes SELel_1 and SELel_2 is substantially lengthened. Accordingly, it is possible to inhibit an off-leakage current of the half-selected cell.

Third Embodiment

Figure 31A:
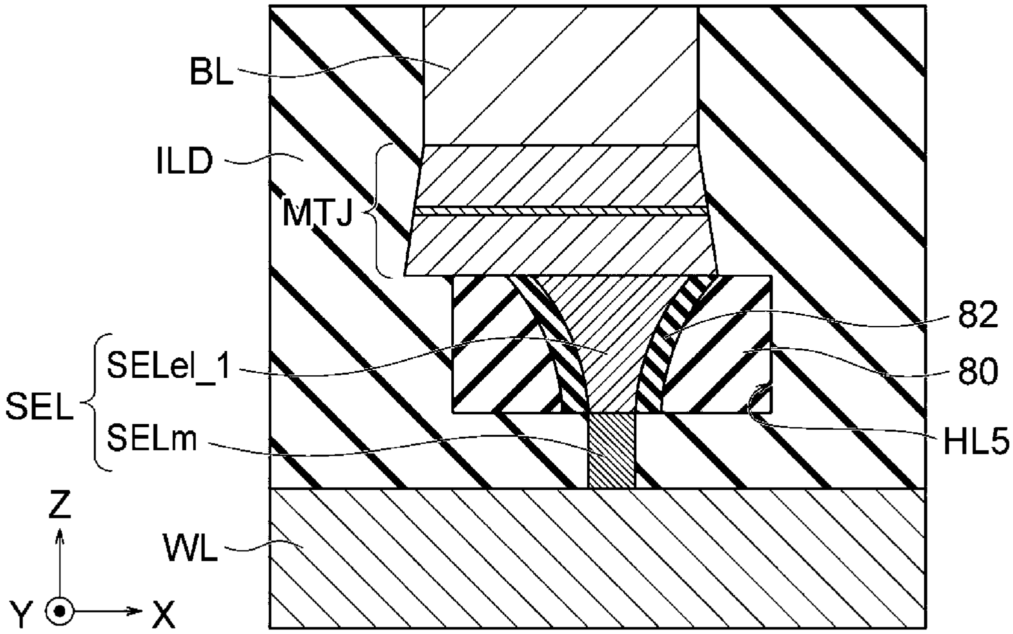
FIG. 31A is a sectional view illustrating a configuration example of a magnetoresistive element and a selector according to a third embodiment.
Figure 31B:
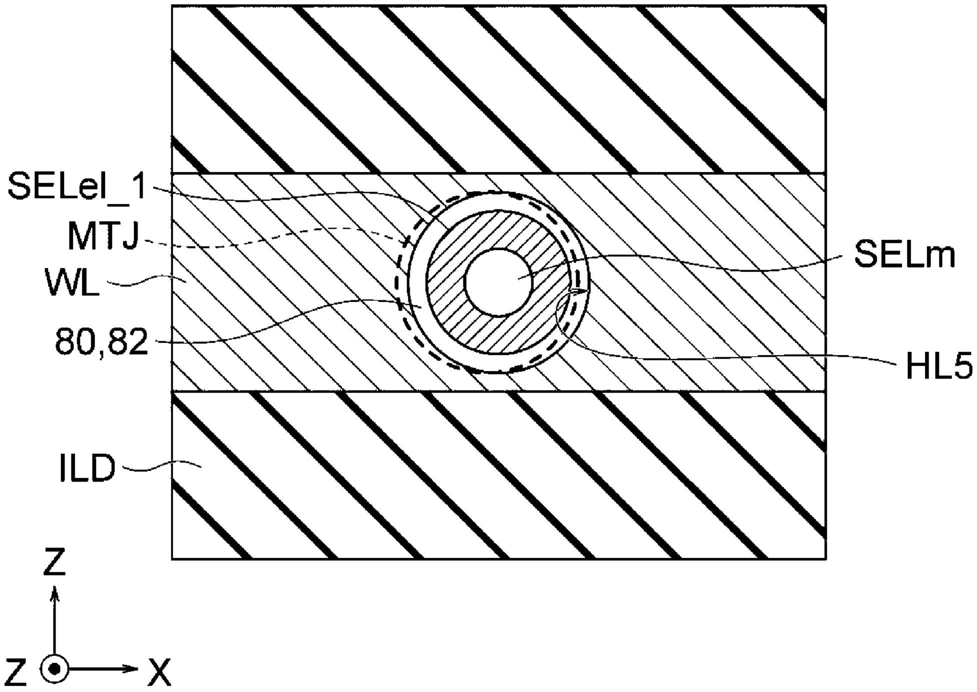
FIG. 31B is a plan view illustrating a configuration example of the magnetoresistive element and the selector according to the third embodiment.

FIG. 31A is a sectional view illustrating a configuration example of a magnetoresistive element MTJ and a selector SEL according to a third embodiment. FIG. 31B is a plan view illustrating a configuration example of the magnetoresistive element MTJ and the selector SEL according to the third embodiment. In the third embodiment, a disposition relation between the magnetoresistive element MTJ and the selector SEL is opposite, and thus magnetoresistive element MTJ is disposed above the selector SEL in the Z direction. Accordingly, the selector SEL is provided on the word line WL. The magnetoresistive element MTJ is provided on the selector SEL. The bit line BL is provided on the magnetoresistive element MTJ. The selector SEL according to the third embodiment is configured with the electrode SELel_1 and the selector material SELm, and does not include the electrode SELel_2.

The selector material SELm of the selector SEL according to the third embodiment is formed by introducing an impurity into the interlayer insulating film ILD. For example, an insulating material such as a silicon oxide film is used for the interlayer insulating film ILD. For example, arsenic, phosphorus, antimony, boron, or the like is used as the impurity. The selector material SELm in which the impurity is introduced into the insulating material has the switching function described with reference to FIG. 7. As illustrated in FIG. 31A, the selector material SELm is connected between the bottom of the electrode SELel_1 and the word line WL. The interlayer insulating film ILD surrounds the circumference of the selector material SELm. As illustrated in FIG. 31B, in a plan view when viewed in the Z direction, the area of the selector material SELm is less than that of the magnetoresistive element MTJ and the electrode SELel_1.

In a plan view when viewed in the Z direction, the area of the electrode SELel_1 of the selector SEL is relatively broader on the side of the magnetoresistive element MTJ, but decreases closer to the selector material SELm. It is because an insulating film 80 in the circumference of the electrode SELel_1 is used as a mask when the selector material SELm is formed in the process of implanting the impurity. As illustrated in FIG. 31B, since the electrode SELel_1 is buried in the insulating film 80 and an impurity layer 82, the electrode SELel_1 has substantially the same size as the selector material SELm as the electrode SELel_1 is closer to the selector material SELm along the inner wall shape of the insulating film 80 and the impurity layer 82. For example, an insulating material such as a silicon nitride film (SiN) is used for the insulating film 80. In a plan view when viewed in the Z direction, the area of the electrode SELel_1 is less than an area surrounded by the outer edge of the insulating film 80 or the impurity layer 82. The area of the selector material SELm is further less than the area of the electrode SELel_1.

The impurity layer 82 is provided between the insulating film 80 and the electrode SELel_1. The impurity layer 82 is formed by introducing an impurity into the insulating film 80 in the process of forming the selector material SELm.

The insulating film 80 is provided along the inner wall of a hollow HL5 formed in the interlayer insulating film ILD. In the central portion of the insulating film 80, a through via hole is provided in the Z direction and the electrode SELel_1 is provided in the through via hole. As illustrated in FIG. 31B, in a plan view when viewed in the Z direction, the size of the hollow HL5 (the size of the outer edge of the insulating film 80) may be substantially the same as the size of the magnetoresistive element MTJ.

The other configurations of the third embodiment may be the same as the corresponding configurations of the first embodiment. According to the third embodiment, the area of the selector material SELm is less than the area of the magnetoresistive element MTJ when viewed in the Z direction. When viewed in the Z direction, the area of the bottom surface of the electrode SELel_1 is also less than the area of the magnetoresistive element MTJ. Accordingly, in the third embodiment, it is possible to obtain the advantages same as those of the first embodiment.

In the third embodiment, the area of the electrode SELel_1 on the side of the magnetoresistive element MTJ is less than the area of the magnetoresistive element MTJ on the side of the electrode SELel_1, and the upper surface of the electrode SELel_1 is covered with the bottom surface of the magnetoresistive element MTJ. Accordingly, in a manufacturing process to be described below, a material of the electrode SELel_1 (for example, TiN) is recoiled in an etching process to inhibit attaching to the side surface of the magnetoresistive element MTJ. Thus, a short-circuit path (shunt path) by the material of the electrode SELel_1 is inhibited to be formed on the side surface of the magnetoresistive element MTJ.

Next, a method of manufacturing a magnetic storage device 1 according to the third embodiment will be described.

FIGS. 32 to 40 are sectional views illustrating an example of a manufacturing method for a semiconductor storage device according to the third embodiment.

First, the plurality of word lines WL are formed above a substrate (not illustrated). The plurality of word lines WL extend in the X direction and are located in the Y direction. For example, a conductive material such as tungsten (W) or titanium nitride (TiN) is used for the word lines WL.

Figure 32:
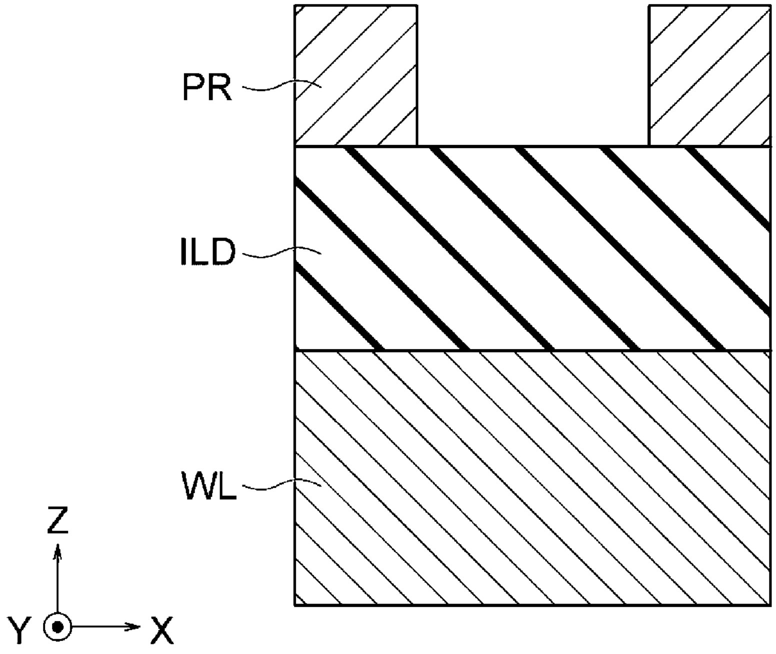
FIG. 32 is a sectional view illustrating an example of a manufacturing method for a semiconductor storage device according to the third embodiment.

Subsequently, the interlayer insulating film ILD is deposited on the word line WL. For example, an insulating material such as a silicon oxide film is used for the interlayer insulating film ILD. Subsequently, as illustrated in FIG. 32, a photoresist PR is formed on the interlayer insulating film ILD using a lithographic technology. The photoresist PR is patterned so that a region other than the magnetoresistive element MTJ or the selector SEL (the memory cell MC) is covered.

Figure 33:
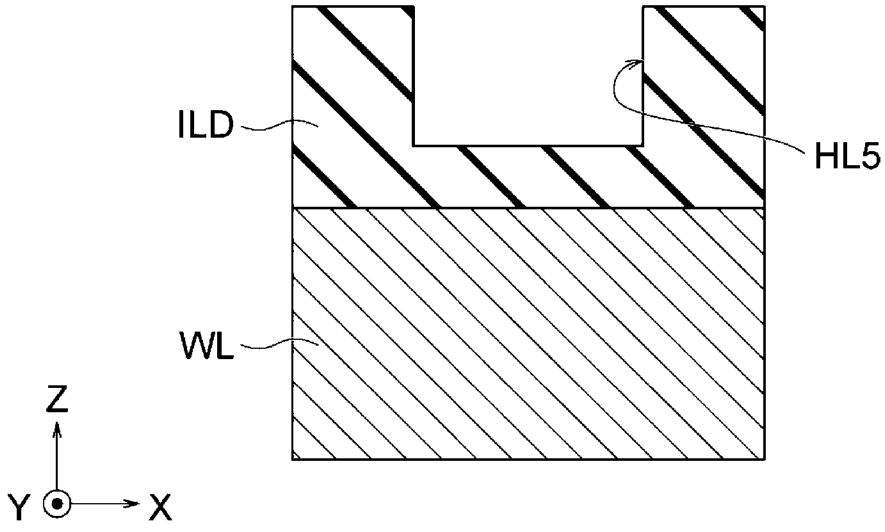
FIG. 33 is a sectional view illustrating an example of the manufacturing method after FIG. 32.

Subsequently, the interlayer insulating film ILD is etched by an RIE method using the photoresist PR as a mask. Accordingly, as illustrated in FIG. 33, the hollow HL5 is formed in the interlayer insulating film ILD. The hollow HL5 is formed in a region of the magnetoresistive element MTJ or the selector SEL to correspond to the size of the memory cell MC. The hollow HL5 is formed from the upper surface to the middle of the interlayer insulating film ILD and does not reach the word line WL.

Figure 34:
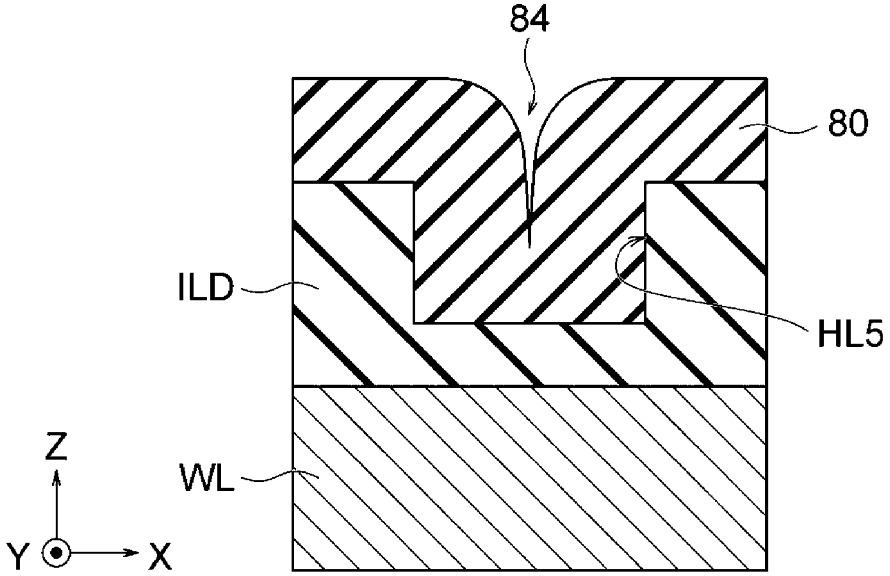
FIG. 34 is a sectional view illustrating an example of the manufacturing method after FIG. 33.

Subsequently, as illustrated in FIG. 34, the insulating film 80 is deposited on the interlayer insulating film ILD using a physical vapor deposition (PVD) method or an ALD method. The insulating film 80 is also formed in the hollow HL5. The insulating film 80 is deposited to have a seam 84 in the hollow HL5. For example, a silicon nitride film is used for the insulating film 80.

Figure 35:
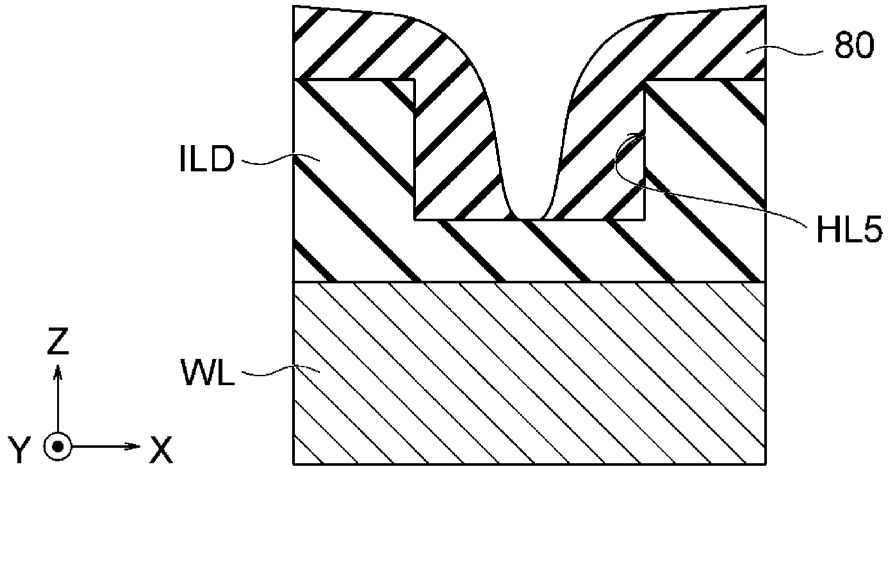
FIG. 35 is a sectional view illustrating an example of the manufacturing method after FIG. 34.

Subsequently, as illustrated in FIG. 35, the insulating film 80 is isotropically etched using a chemical dry etching (CDE) method, a wet etching method, or the like. Accordingly, the insulating film 80 is isotropically etched from the seam 84 of the insulating film 80 so that the interlayer insulating film ILD is exposed on the bottom of the hollow HL5. An exposure area of the interlayer insulating film ILD corresponds to the area of the selector material SELm when viewed in the Z direction. Accordingly, the exposure area of the interlayer insulating film ILD is less than the area of the magnetoresistive element MTJ when viewed in the Z direction.

Figure 36:
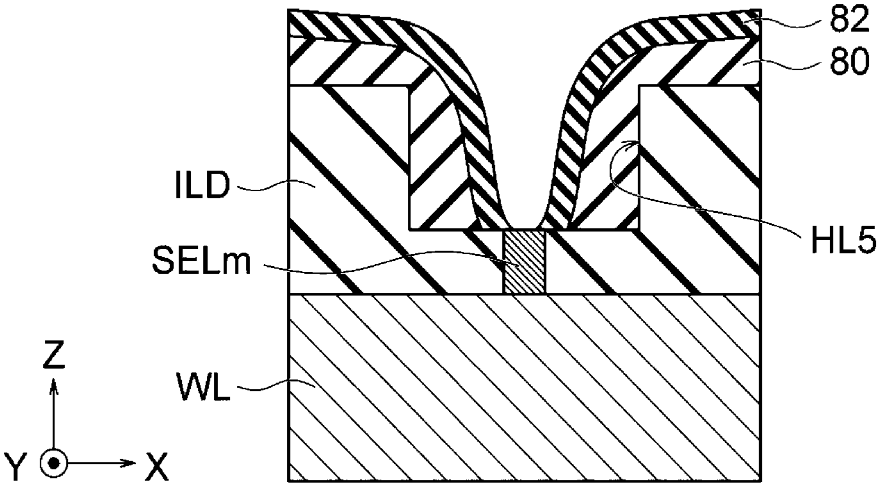
FIG. 36 is a sectional view illustrating an example of the manufacturing method after FIG. 35.

Subsequently, in the implanting process, an impurity is introduced in the Z direction using the insulating film 80 as a mask. For example, arsenic, phosphorus, antimony, boron, or the like is used as the impurity. Accordingly, as illustrated in FIG. 36, the selector material SELm penetrates through the interlayer insulating film ILD in the bottom of the hollow HL5. That is, the selector material SELm is formed between the word line WL and the bottom of the hollow HL5. The impurity is introduced to the surface of the insulating film 80 and the impurity layer 82 is formed on the surface of the insulating film 80.

Figure 37:
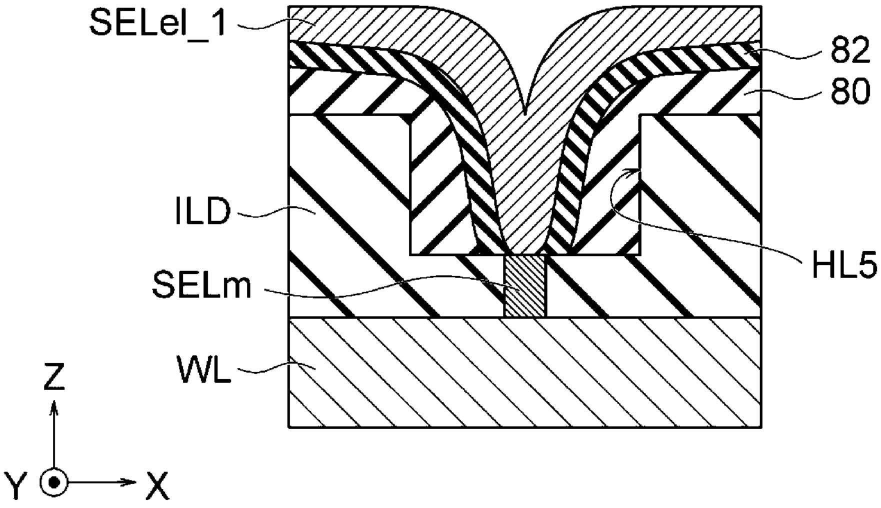
FIG. 37 is a sectional view illustrating an example of the manufacturing method after FIG. 36.

Subsequently, as illustrated in FIG. 37, the material of the electrode SELel_1 (for example, TiN) is deposited on the impurity layer 82 using a PVD method, an ALD method, or the like. The material of the electrode SELel_1 is buried in the impurity layer 82 and the insulating film 80 in the hollow HL5. Accordingly, the material of the electrode SELel_1 is connected to the selector material SELm on the bottom of the hollow HL5.

Figure 38:
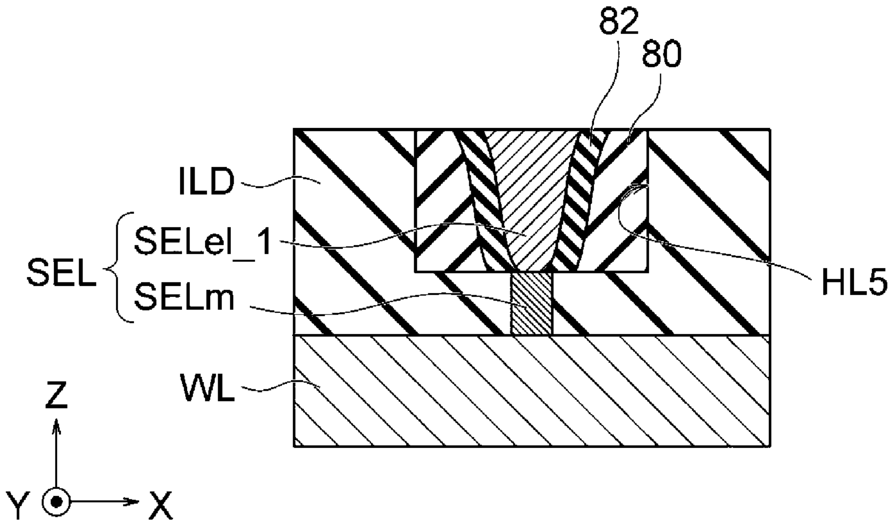
FIG. 38 is a sectional view illustrating an example of the manufacturing method after FIG. 37.

Subsequently, the material of the electrode SELel_1, the impurity layer 82, and the insulating film 80 are polished by a CMP method until the interlayer insulating film ILD is exposed. Accordingly, as illustrated in FIG. 38, the electrode SELel_1 surrounded by the insulating film 80 and the impurity layer 82 is formed in each hollow HL5. The electrode SELel_1 becomes thinner as the electrode SELel_1 is closer to the side of the selector material SELm from the side of the magnetoresistive element MTJ in the Z direction. The bottom of the electrode SELel_1 has substantially the same size as the selector material SELm.

Subsequently, the material of the magnetoresistive element MTJ is stacked on the electrode SELel_1, the insulating film 80, the impurity layer 82, and the interlayer insulating film ILD. For example, as described with reference to FIG. 6, the materials of the ferromagnetic body 41, the non-magnetic body 42, the ferromagnetic body 43, the non-magnetic body 44, and the ferromagnetic body 45 are stacked in this order.

Figure 39:
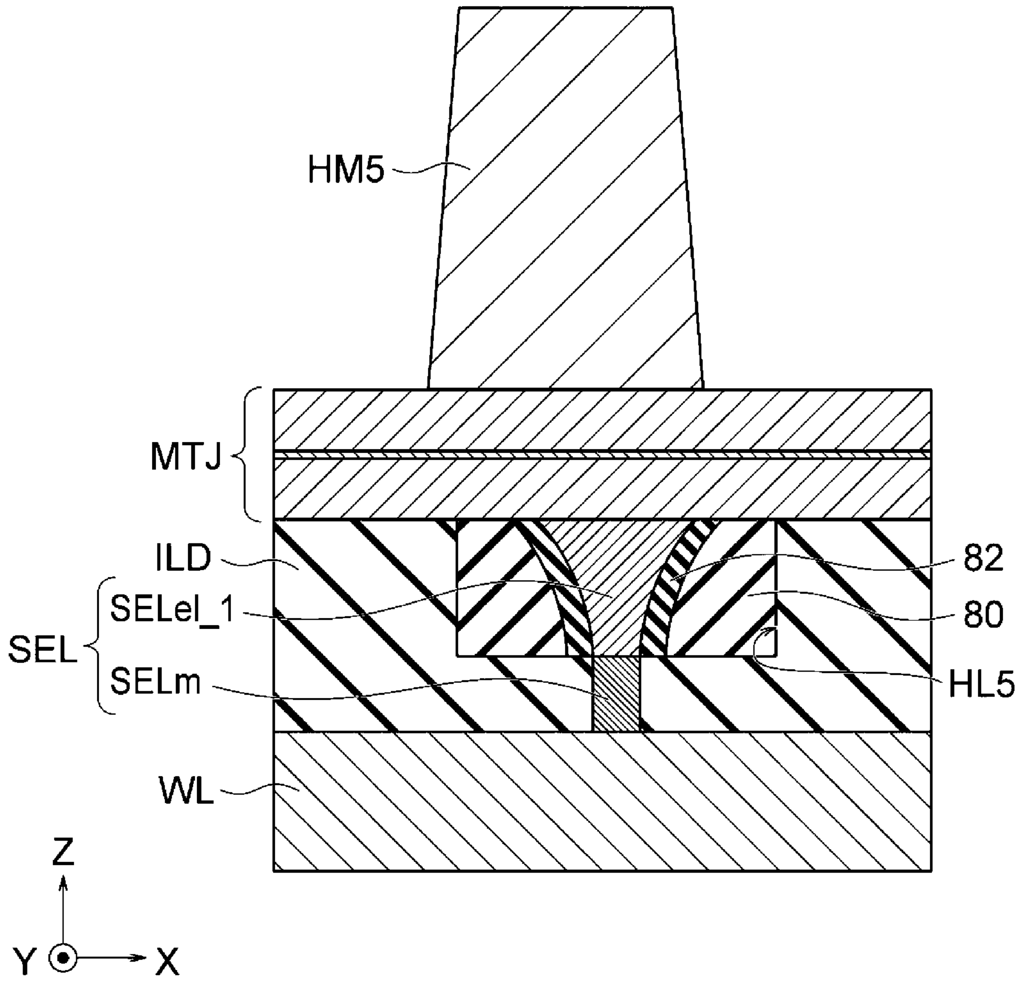
FIG. 39 is a sectional view illustrating an example of the manufacturing method after FIG. 38.

Subsequently, the material of the hard mask HM5 is deposited on the material of the magnetoresistive element MTJ. For example, a metal material is used for the hard mask HM5. Subsequently, the hard mask HM5 is processed to be left in a region where the magnetoresistive element MTJ is formed using a lithographic technology and an etching technology, as illustrated in FIG. 39.

Figure 40:
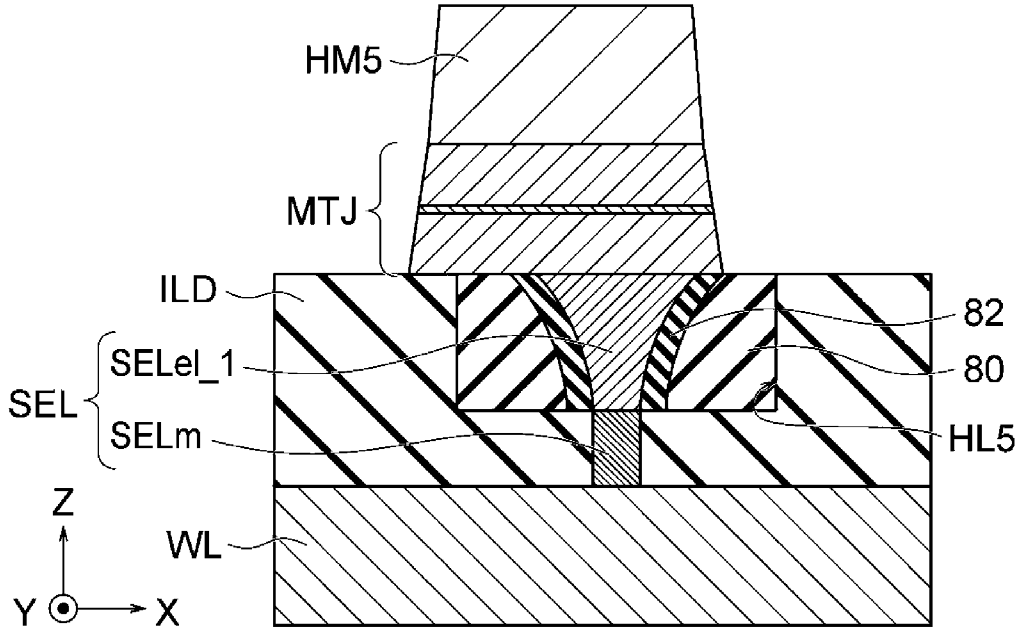
FIG. 40 is a sectional view illustrating an example of the manufacturing method after FIG. 39.

Subsequently, the material of the magnetoresistive element MTJ is etched using the hard mask HM5 as a mask by an IBE method. Accordingly, the magnetoresistive element MTJ is formed on the electrode SELel_1. Here, as illustrated in FIG. 40, even when the magnetoresistive element MTJ slightly deviates from the selector SEL or the hollow HL5 in the X-Y plane, the material of the electrode SELel_1 is not exposed from the bottom surface of the magnetoresistive element MTJ since the electrode SELel_1 is provided in the insulating film 80 in the hollow HL5. Even when the electrode SELel_1 is slightly exposed from the magnetoresistive element MTJ, a thickness at the end of the electrode SELel_1 is thin and the impurity layer 82 is provided immediately below the electrode SELel_1. Accordingly, an etching amount of the electrode SELel_1 is small and the material of the electrode SELel_1 (for example, TiN) recoiled and attached to the side surface of the magnetoresistive element MTJ is very small. Accordingly, it is possible to inhibit a short-circuit path (shunt path) by the material of the electrode SELel_1 from being formed on the side surface of the magnetoresistive element MTJ.

Subsequently, the hard mask HM5 is removed, the bit line BL is formed on the magnetoresistive element MTJ, and the interlayer insulating film ILD is further deposited. Accordingly, the magnetic storage device 1 illustrated in FIGS. 31A and 31B is completed.

As such, according to the third embodiment, the area of the upper surface of the electrode SELel_1 is less than the area of the bottom surface of the magnetoresistive element MTJ. Accordingly, the upper surface of the electrode SELel_1 is covered with the magnetoresistive element MTJ. The thickness of the electrode SELel_1 is thin at the end of the upper surface of the electrode SELel_1. Accordingly, when the material of magnetoresistive element MTJ is processed by etching, it is possible to inhibit the material of the electrode SELel_1 (for example, TiN) from being recoiled and attached to the side surface of the magnetoresistive element MTJ. As a result, it is possible to inhibit a short-circuit path (shunt path) by the material of the electrode SELel_1 from being formed on the side surface of the magnetoresistive element MTJ, in particular, the side surface of the non-magnetic body 42.

The electrode SELel_1 becomes wider as the electrode SELel_1 is closer to the magnetoresistive element MTJ in the Z direction. Accordingly, since the contact area between the electrode SELel_1 and the magnetoresistive element MTJ is set to be relatively large, contact resistance between the electrode SELel_1 and the magnetoresistive element MTJ can be made low.

Fourth Embodiment

Figure 41:
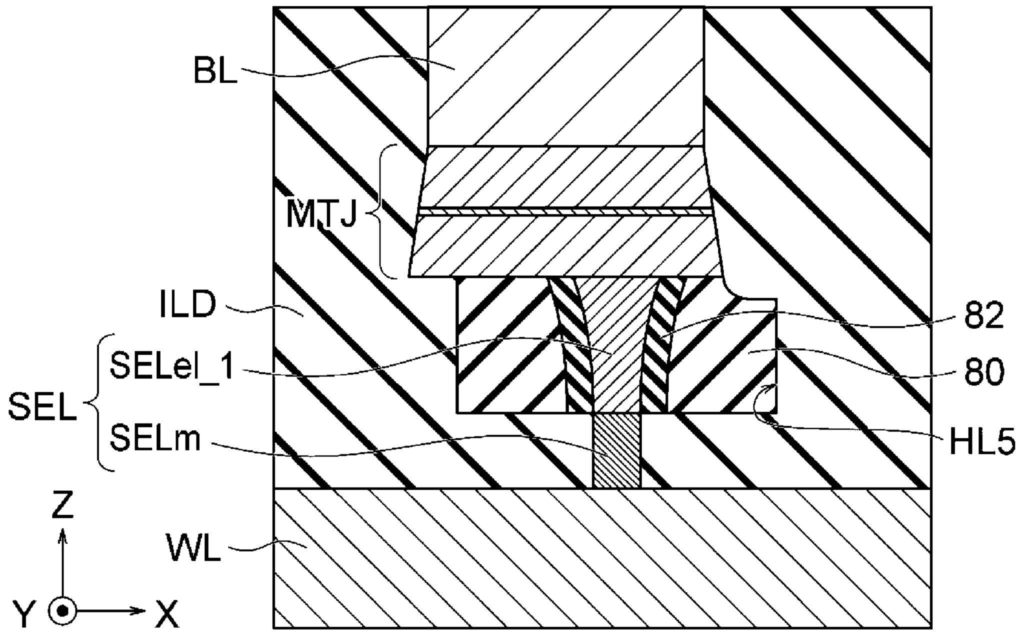
FIG. 41 is a sectional view illustrating a configuration example of a magnetoresistive element and a selector according to a fourth embodiment.

FIG. 41 is a sectional view illustrating a configuration example of a magnetoresistive element MTJ and a selector SEL according to a fourth embodiment. The electrode SELel_1 according to the fourth embodiment is thinner than the electrode SELel_1 according to the third embodiment. For example, a contact area of the electrode SELel_1 with respect to the magnetoresistive element MTJ is less than the contact area according to the third embodiment. Accordingly, the bottom surface of the magnetoresistive element MTJ faces the electrode SELel_1 only at the central portion. The region other than the bottom surface of the magnetoresistive element MTJ is in contact with the insulating film 80, the impurity layer 82, or the interlayer insulating film ILD.

In the electrode SELel_1 according to the fourth embodiment, a film thickness or an etching condition of the insulating film 80 described with reference to FIGS. 34 and 35 may be changed. The other manufacturing steps according to the fourth embodiment may be the same as the corresponding steps according to the third embodiment.

The electrode SELel_1 according to the fourth embodiment is thinner than the electrode SELel_1 according to the third embodiment, and the material of the electrode SELel_1 is not exposed from the magnetoresistive element MTJ when the magnetoresistive element MTJ is formed. Accordingly, when the material of the magnetoresistive element MTJ is processed by etching, it is possible to further reliably inhibit the material of the electrode SELel_1 (for example, TiN) from being recoiled and attached to the side surface of the magnetoresistive element MTJ. As a result, it is possible to further reliably inhibit a short-circuit path (shunt path) by the material of the electrode SELel_1 from being formed on the side surface of the magnetoresistive element MTJ, in particular, the side surface of the non-magnetic body 42. In the fourth embodiment, it is possible to obtain the advantages same as those of the third embodiment.

Fifth Embodiment

Figure 42:
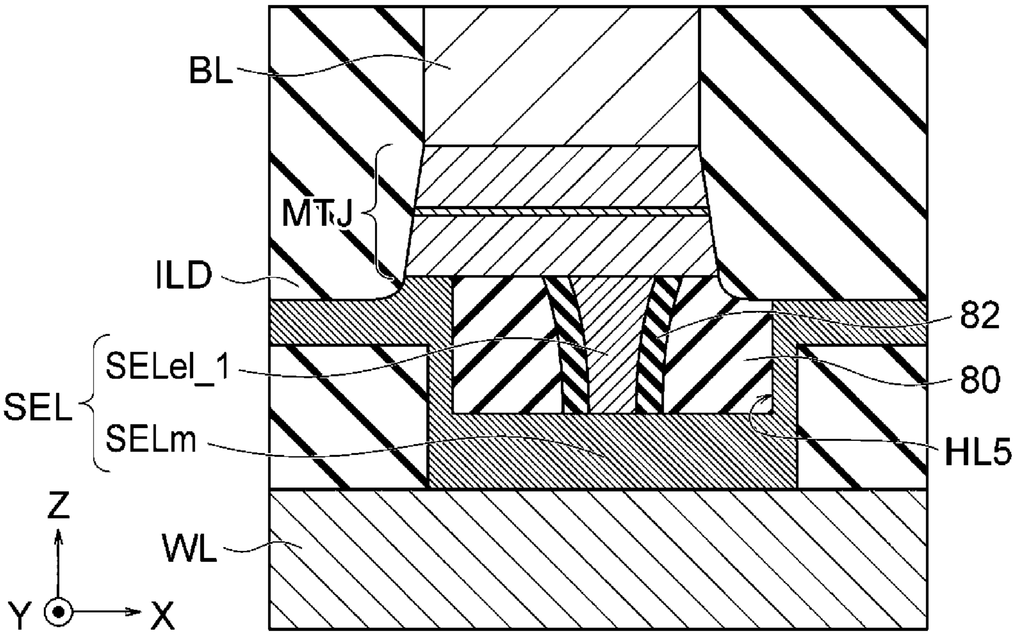
FIG. 42 is a sectional view illustrating a configuration example of a magnetoresistive element and a selector according to a fifth embodiment.

FIG. 42 is a sectional view illustrating a configuration example of a magnetoresistive element MTJ and a selector SEL according to a fifth embodiment. In the fifth embodiment, the selector material SELm is an impurity layer formed by introducing an impurity into the surface of the interlayer insulating film ILD and an inner wall surface of the hollow HL5. When viewed in the Z direction, the area of the selector material SELm is greater than the area of the electrode SELel_1. The area of the electrode SELel_1 on the side of the selector material SELm is less than the area of the magnetoresistive element MTJ. The selector material SELm is provided around the electrode SELel_1.

For example, an insulating material such as a silicon oxide film is used for the interlayer insulating film ILD. For example, arsenic, phosphorus, antimony, boron, or the like is used as the impurity introduced to form the selector material SELm.

As such, the selector material SELm is provided widely on the surface of the interlayer insulating film ILD and the inner wall of the hollow HL5. The selector SEL includes the selector material SELm provided relatively widely around the electrode SELel_1 as such.

Figure 43:
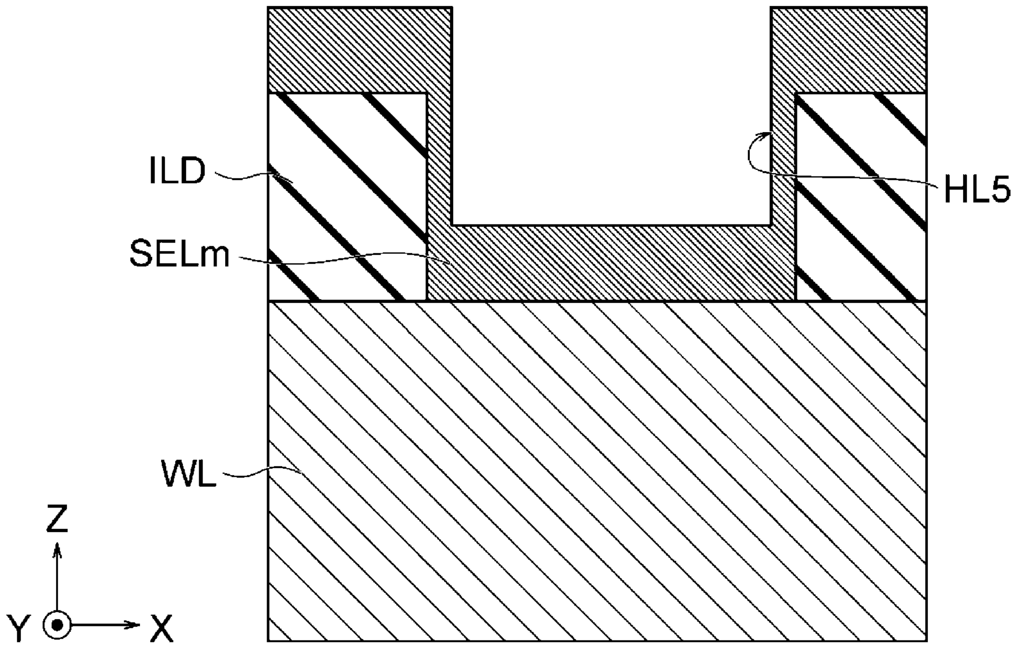
FIG. 43 is a sectional view illustrating a process of forming a selector material according to the fifth embodiment.

FIG. 43 is a sectional view illustrating a process of forming the selector material SELm according to the fifth embodiment. The selector material SELm according to the fifth embodiment can be formed by introducing an impurity (for example, arsenic, phosphorus, antimony, or boron) in the process illustrated in FIG. 33. Accordingly, as illustrated in FIG. 43, the selector material SELm is formed in the surface of the interlayer insulating film ILD and in the interlayer insulating film ILD of the side wall and the bottom of the hollow HL5. On the other hand, the process of implanting the impurity, as described with reference to FIG. 36, will be omitted.

A method of forming the insulating film 80 and the electrode SELel_1 may be the same as the method according to the fourth embodiment. Accordingly, it is possible to form the magnetic storage device 1 according to the fifth embodiment.

According to the fifth embodiment, the area of the selector material SELm is greater than in the fourth embodiment, but the electrode SELel_1 is thin to be substantially the same as the electrode SELel_1 according to the fourth embodiment. Accordingly, in the fifth embodiment, the contact area between the electrode SELel_1 and the selector material SELm can be set to be small. Accordingly, it is possible to inhibit an off-leakage current of the half-selected cell. The other configurations according to the fifth embodiment may be similar to those of the fourth embodiment. Accordingly, In the fifth embodiment, it is possible to obtain the advantages same as those of the fourth embodiment.

The fifth embodiment may be combined with the third embodiment. Here, since the contact area between the electrode SELel_1 and the magnetoresistive element MTJ is relatively large, contact resistance between the electrode SELel_1 and the magnetoresistive element MTJ can be reduced.

Sixth Embodiment

Figures 44, 45:
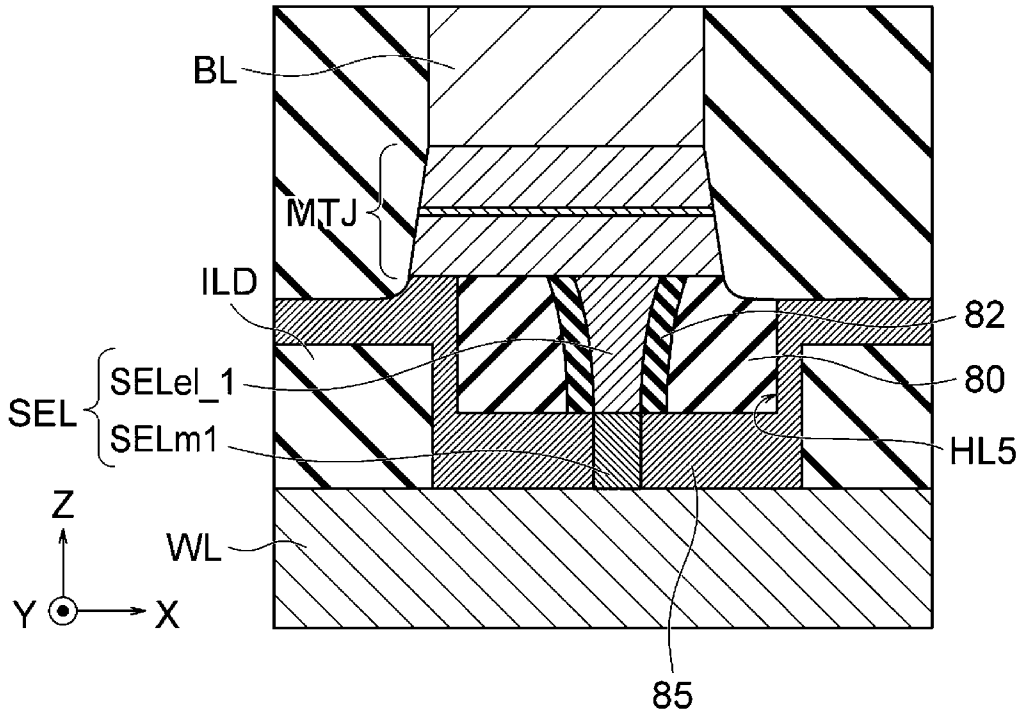
FIG. 44 is a sectional view illustrating a configuration example of a magnetoresistive element and a selector according to a sixth embodiment.
FIG. 45 is a table illustrating thermal conductivity and electric resistivity of various materials that contain beryllium, magnesium, and/or nitrogen.

FIG. 44 is a sectional view illustrating a configuration example of a magnetoresistive element MTJ and a selector SEL according to a sixth embodiment. A selector material SELm1 is a portion that functions as a selector in which an impurity such as arsenic, phosphorus, antimony, boron, or the like is contained in an insulating film 85. The insulating film 85 is an insulating material that has thermal conductivity that is greater than the interlayer insulating film ILD and electric resistivity that is substantially the same as the interlayer insulating film ILD.

For example, an insulating material such as a silicon oxide film is used for the interlayer insulating film ILD. As the impurity introduced to form the insulating film 85, for example, one of beryllium (Be), magnesium (Mg), and nitrogen (N) is used. When such an impurity is introduced into the interlayer insulating film ILD, for example, SixBeyO (where x and y are integers), SixNyO, or SixMgyO is formed.

The selector material SELm1 is formed by further introducing arsenic, phosphorus, antimony, or boron into the interlayer insulating film ILD into which the impurity of the insulating film 85 is introduced. Accordingly, in the selector material SELm1, SixBeyO (where x and y are integers), SixNyO, or SixMgyO containing arsenic, phosphorus, antimony, or boron is formed.

The insulating film 85 according to the sixth embodiment is formed in the process illustrated in FIG. 33 by introducing an impurity (for example, beryllium, magnesium, or nitrogen) into the interlayer insulating film ILD in the implanting process. Here, the shape of the insulating film 85 may be the same as the shape of the selector material SELm of FIG. 43.

After executing the processes described with reference to FIGS. 34 and 35, an impurity (for example, arsenic, phosphorus, antimony, or boron) is introduced into the insulating film 85 exposed from the insulating film 80 using the insulating film 80 as a mask in the implanting process. Accordingly, the selector material SELm1 can be formed. The other processes of the sixth embodiment may be the same as the corresponding processes of any the third to fifth embodiments. Accordingly, it is possible to form the magnetic storage device 1 according to the sixth embodiment.

FIG. 45 is a table illustrating thermal conductivity and electric resistivity of various materials that contain beryllium, magnesium, and/or nitrogen. From the table, it can be understood that a material including beryllium, magnesium, or nitrogen has higher thermal conductivity than a silicon oxide film and has substantially the same electric resistivity as the silicon oxide film.

The material of the insulating film 85 includes a material that has higher thermal conductivity than a silicon oxide film and has substantially the same electric resistivity as the silicon oxide film. The thermal conductivity of the silicon oxide film is about 1.4 W/m·K. The electric resistivity of the silicon oxide film is about $1\times10^{16}$ Ω·cm.

The material of the insulating film 85 may be, in addition to SixBeyO, SixNyO, or SixMgyO, beryllium oxide (BeO) (where thermal conductivity is about 250 W/m·K, electric resistivity is about $1\times10^{16}$ Ω·cm, and a crystal structure is wurtzite type), aluminum nitride (AlN) (where thermal conductivity is about 285 W/m·K, electric resistivity is about $1\times10^{14}$ Ω·cm, and a crystal structure is wurtzite type), magnesium oxide (MgO) (where thermal conductivity is about 59 W/m·K, electric resistivity is about $1\times10^{14}$ Ω·cm, and a crystal structure is a rock salt type), or silicon nitride ($Si_3N_4$) (where thermal conductivity is about 25 to 54 W/m·K, electric resistivity is about $1\times10^{14}$ Ω·cm, and a crystal structure is hexagonal crystal). The material of the selector material SELm1 is a material in which an impurity such as arsenic, phosphorus, antimony, or boron is introduced into the material of the insulating film 85.

As such, the insulating film 85 according to the sixth embodiment has higher thermal conductivity than the interlayer insulating film ILD and has substantially the same electric resistivity as the interlayer insulating film ILD.

By forming the insulating film 85 widely on the surface of the interlayer insulating film ILD and the inner wall of the hollow HL5, it is possible to efficiently dissipate heat generated in the selector SEL.

Here, when the outer circumferential surface of the selector SEL is covered with a material that has low thermal conductivity, such as the interlayer insulating film ILD (for example, a silicon oxide film), a Joule heat generated in the selector SEL is hardly escaped and a temperature of the selector SEL is easily raised.

When the temperature of the selector SEL is raised, an ON state is continued in some cases although a voltage applied to the selector SEL is relatively low. That is, a voltage of the selector SEL when the selector SEL is switched from the ON state to the OFF state (hold voltage) decreases in some cases. When a difference between the hold voltage and a voltage when the selector SEL is switched from the OFF state to the ON state (threshold voltage) increases, a transiently large current (spike current) may flow in the memory cell MC when switching the selector SEL from the OFF state to the ON state in some cases. Here, data of the magnetoresistive element MTJ may be rewritten or the memory cell MC may deteriorate in some cases.

An influence of the heat of the selector SEL may deteriorate the magnetoresistive element MTJ in some cases. Here, there is concern that a data retention property of the magnetoresistive element MTJ may deteriorate.

However, the insulating film 85 formed by a material having higher thermal conductivity than a silicon oxide film is provided around the selector SEL according to the sixth embodiment. Accordingly, it is possible to inhibit deterioration of data or deterioration of properties of the magnetoresistive element MTJ.

The area of the insulating film 85 is large, but the electrode SELel_1 is thin to be substantially the same as the electrode SELel_1 according to the fourth embodiment. Accordingly, it is possible to inhibit a short-circuit path (shunt path) by the material of the electrode SELel_1 from being formed on the side surface of the magnetoresistive element MTJ, in particular, the side surface of the nonmagnetic body 42. The area of the selector material SELm1 is less than the area of the magnetoresistive element MTJ when viewed in the Z direction. The area of the bottom surface of the electrode SELel_1 is less than the area of the magnetoresistive element MTJ when viewed in the Z direction. Accordingly, it is possible to inhibit the off-leakage current of the half-selected cell.

The sixth embodiment may be combined with the third embodiment. Here, since the contact area between the electrode SELel_1 and the magnetoresistive element MTJ is relatively large, contact resistance between the electrode SELel_1 and the magnetoresistive element MTJ can be reduced.

Seventh Embodiment

Figure 46:
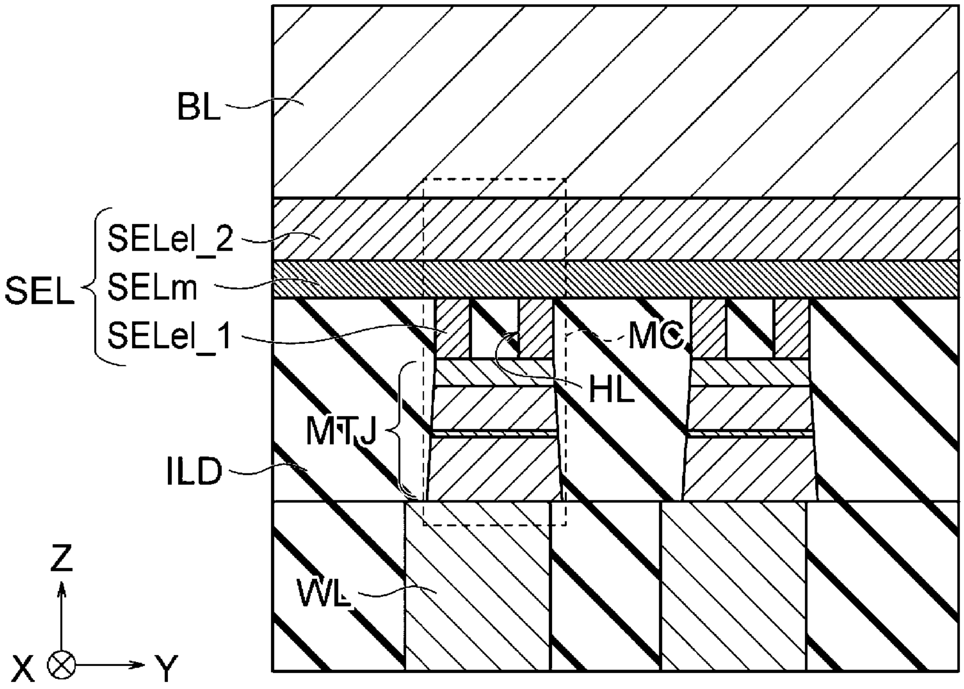
FIG. 46 is a sectional view illustrating a configuration example of a magnetoresistive element and a selector according to a seventh embodiment.

FIG. 46 is a sectional view illustrating a configuration example of a magnetoresistive element MTJ and a selector SEL according to a seventh embodiment. FIG. 46 illustrates a cross-sectional configuration in the extension direction of the bit line BL (Y direction). The cross-sectional configuration in the extension direction of the word line WL (X direction) may be the same as the configuration illustrated in FIG. 4.

In the seventh embodiment, the selector material SELm and the electrode SELel_2 each extend in the Y direction and are located in the X direction as same as the bit line BL immediately below the bit line BL. The selector material SELm and the electrode SELel_2 can constitute a part of the selector SEL and can function as the bit line BL. Accordingly, the selector material SELm and the electrode SELel_2 can be processed next to the bit line BL when processing the bit line BL. Accordingly, the manufacturing process can be shortened and alignment of the bit line BL, the selector material SELm, and the electrode SELel_2 is inhibited from deviating.

The other configurations according to the seventh embodiment may be similar to those of the first to sixth embodiments. Accordingly, In the seventh embodiment, it is possible to obtain the advantages same as those of any of the first to sixth embodiments.

Eighth Embodiment

Figure 47:
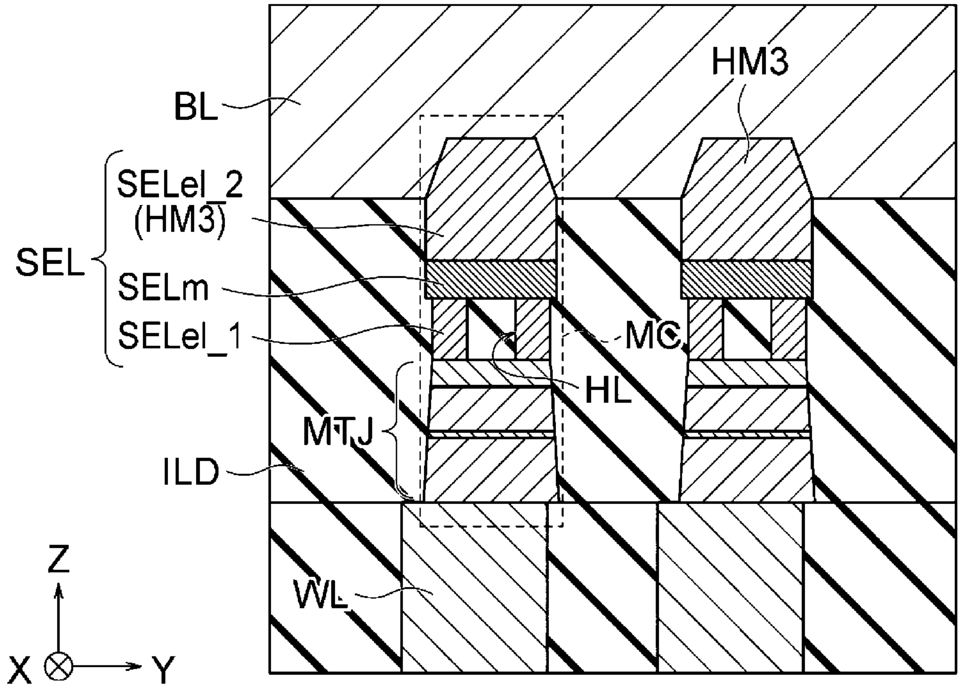
FIG. 47 is a sectional view illustrating a configuration example of a magnetoresistive element and a selector according to an eighth embodiment.
Figure 48:
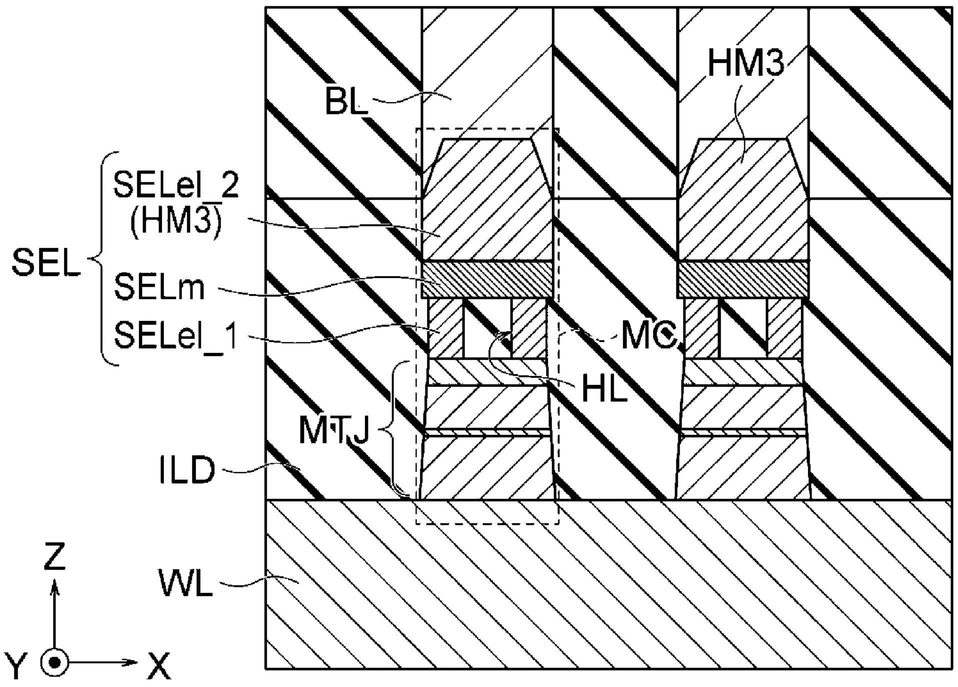
FIG. 48 is a sectional view illustrating a configuration example of the magnetoresistive element and the selector according to the eighth embodiment.

FIGS. 47 and 48 are sectional views illustrating a configuration example of a magnetoresistive element MTJ and a selector SEL according to an eighth embodiment. FIG. 47 illustrates a cross section in a direction oriented along the bit line BL. FIG. 48 illustrates a cross section in a direction oriented along the word line WL.

In the eighth embodiment, the hard mask HM3 is used as the electrode SELel_2. For example, when a conductive material such as carbon (C), titanium nitride (TiN), or tungsten (W) is used for the hard mask HM3, the hard mask HM3 can be used as the electrode SELel_2. Here, in the process illustrated in FIGS. 16A and 16B, the hard mask HM3 may be deposited on the material of the selector material SELm and deposition of the material of the electrode SELel_2 may be omitted. After the hard mask HM3 is processed, the material of the selector material SELm is processed using the hard mask HM3 as a mask. The hard mask HM3 may be left as the electrode SELel_2 as it is without being removed. Accordingly, the manufacturing process is accordingly shortened, the size of the selector SEL is reduced, and a cost is reduced.

The other configurations according to the eighth embodiment may be similar to those of the first to seventh embodiments. Accordingly, In the seventh embodiment, it is possible to obtain the advantages same as those of any of the first to seventh embodiments.

Ninth Embodiment

Figure 49:
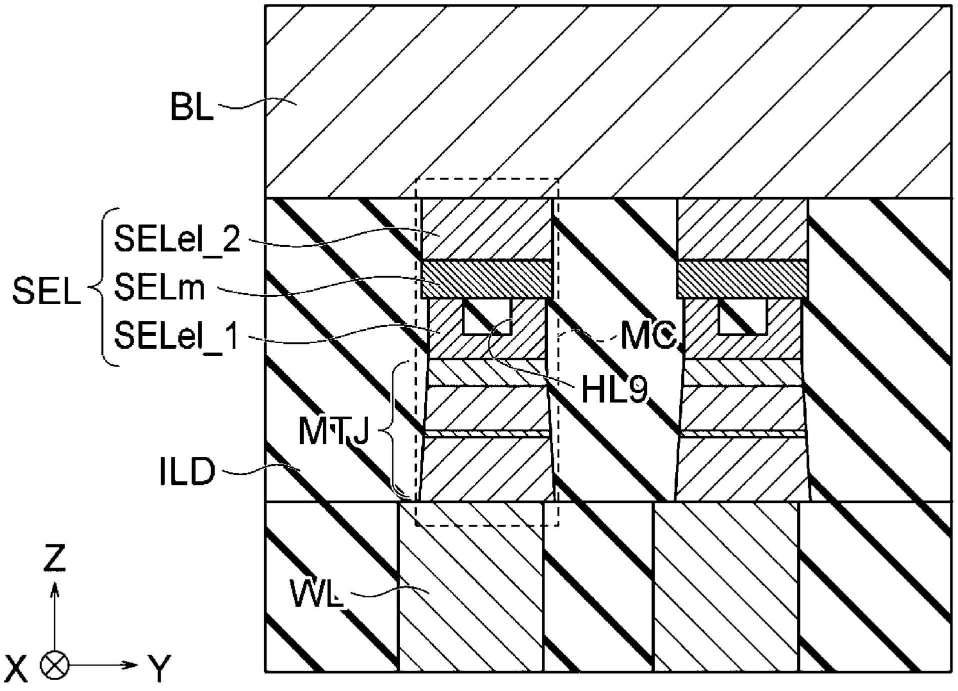
FIG. 49 is a sectional view illustrating a configuration example of a magnetoresistive element and a selector according to a ninth embodiment.
Figure 50:
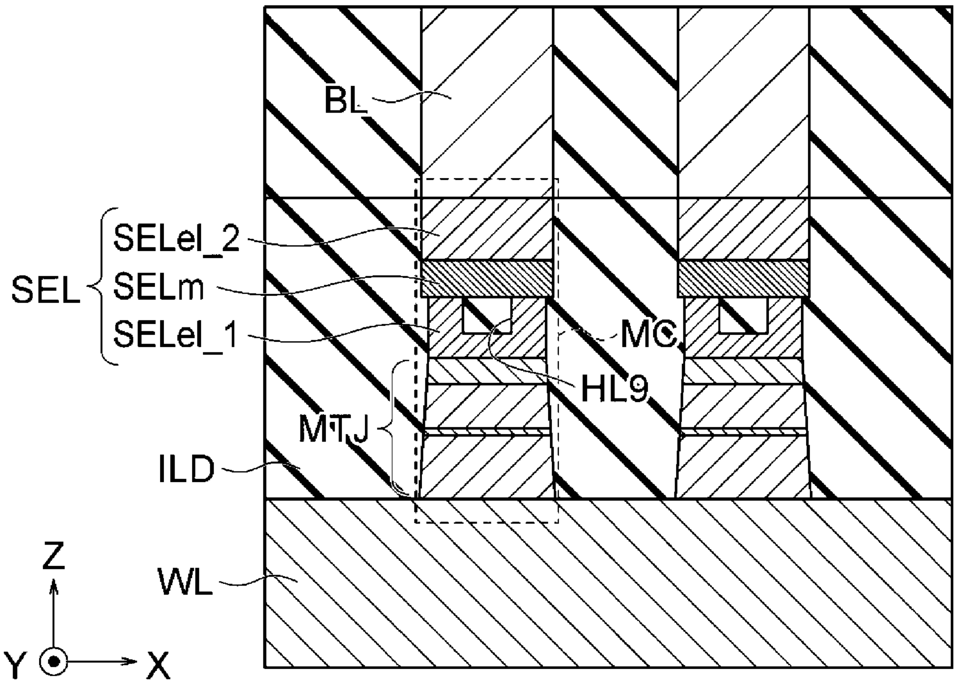
FIG. 50 is a sectional view illustrating a configuration example of the magnetoresistive element and the selector according to the ninth embodiment.

FIGS. 49 and 50 are sectional views illustrating a configuration example of a magnetoresistive element MTJ and a selector SEL according to a ninth embodiment. FIG. 49 illustrates a cross section in a direction oriented along the bit line BL. FIG. 50 illustrates a cross section in a direction oriented along the word line WL.

In the ninth embodiment, a hollow HL9 of the electrode SELel_1 does not penetrate through the electrode SELel_1 and is blocked by the electrode SELel_1 left on the bottom surface on the side of the magnetoresistive element MTJ. The contact area between the selector material SELm and the electrode SELel_1 is less than the area Sselm of the selector material SELm. Accordingly, contact resistance between the selector material SELm and the electrode SELel_1 increases, and thus a current can be inhibited from flowing in the selector material SELm. Thus, in the ninth embodiment, it is possible to obtain advantages similar to those of the first embodiment.

According to the ninth embodiment, after the processes illustrated in FIGS. 8A to 12B are executed, the material of the electrode SELel_1 is polished by a CMP method until the surface of the interlayer insulating film ILD is exposed. Accordingly, as illustrated in FIGS. 49 and 50, the electrode SELel_1 having the hollow HL9 is formed. A structure illustrated in FIGS. 49 and 50 can be obtained through the processes described with reference to FIGS. 14A to 18B.

As in the ninth embodiment, the material of the electrode SELel_1 may be processed by patterning using a CMP method rather than etchback using anisotropic etching. The other configurations and processes according to the ninth embodiment may be similar to the configurations and processes of any of the first to eighth embodiments. Accordingly, In the ninth embodiment, it is possible to obtain the advantages same as those of any of the first to eighth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:

a plurality of first wirings extending in a first direction;

a plurality of second wirings extending in a second direction intersecting the first direction; and a plurality of memory cells connected between the plurality of first wirings and the plurality of second wirings and including selectors each connected in series to variable resistance elements, wherein each of the selectors includes a selector material switching a current flowing to the variable resistance element according to a voltage difference between the first wiring and the second wiring, and first and second electrodes sandwiching the selector material in a portion between the first wiring and the variable resistance element, and a contact area between the first electrode and the selector material is less than an area of the selector material when viewed in a stacking direction of the selector and the variable resistance element.

2. The semiconductor storage device according to claim 1, wherein the first electrode has a cylindrical shape having a through via hole at a central portion when viewed in the stacking direction.

3. The semiconductor storage device according to claim 1, wherein the first electrode has a diameter less than the selector material when viewed in the stacking direction.

4. The semiconductor storage device according to claim 1, wherein the first electrode deviates from a center of the selector material when viewed in the stacking direction.

5. The semiconductor storage device according to claim 1, wherein an oxide of a material of the first electrode having resistance higher than resistance of a central portion of the first electrode is provided in an outer circumferential portion of the first electrode.

6. The semiconductor storage device according to claim 1, wherein a conductive layer in which an impurity is introduced into a material of the first electrode is provided in an outer circumferential portion of the first electrode.

7. The semiconductor storage device according to claim 1, wherein the first electrode includes a plurality of conductive lines provided in an insulator.

8. A semiconductor storage device comprising:

a plurality of first wirings extending in a first direction;

a plurality of second wirings extending in a second direction intersecting the first direction;

a plurality of memory cells connected between the plurality of first wirings and the plurality of second wirings and including selectors each connected in series to variable resistance elements; and a first insulating film provided between the plurality of memory cells, wherein each of the selectors includes a selector material switching a current flowing to the variable resistance element according to a voltage difference between the first wiring and the second wiring, and a first electrode provided between the variable resistance element and the selector material, the selector material is provided between the first electrode and the first wiring and is formed of a first insulating material that contains a first impurity, the first insulating film is formed of the first insulating material that does not contain the first impurity, and an area of the selector material is less than an area of the variable resistance element when viewed in a stacking direction of the selector and the variable resistance element.

9. The semiconductor storage device according to claim 8, wherein the area of the selector material is less than an area of the first electrode when viewed in the stacking direction.

10. The semiconductor storage device according to claim 8, wherein the first insulating material includes silicon (Si) and oxygen (O).

11. The semiconductor storage device according to claim 8, wherein the variable resistance element is a magnetoresistive element.

12. The semiconductor storage device according to claim 8, wherein an area of the first electrode on a side of the selector material is less than an area of the first electrode on a side of the variable resistance element when viewed in the stacking direction.

13. The semiconductor storage device according to claim 8, wherein an area of the first electrode on a side of the variable resistance element is less than an area of the variable resistance element on a side of the first electrode when viewed in the stacking direction.

14. The semiconductor storage device according to claim 8, further comprising:

a second insulating film having an area greater than an area of the first electrode and provided around the selector when viewed in the stacking direction, wherein the second insulating film includes one of beryllium (Be), magnesium (Mg), and nitrogen (N).

15. The semiconductor storage device according to claim 8, wherein the first impurity includes one of arsenic (As), phosphorus (P), antimony (Sb), and boron (B).

16. A semiconductor storage device comprising:

a plurality of first wirings extending in a first direction;

a plurality of second wirings extending in a second direction intersecting the first direction; and a plurality of memory cells connected between the plurality of first wirings and the plurality of second wirings and including selectors each connected in series to variable resistance elements, wherein each of the selectors includes a first selector material switching a current flowing to the variable resistance element according to a voltage difference between the first wiring and the second wiring, and a first electrode provided between the variable resistance element and the first selector material, the first selector material is provided between the first electrode and the first wiring and is formed of an insulating film that contains a first impurity, an area of the first selector material is greater than an area of the first electrode when viewed in a stacking direction of the selector and the variable resistance element, and an area of the first electrode on a side of the first selector material is less than an area of the variable resistance element when viewed in the stacking direction.

17. The semiconductor storage device according to claim 16, wherein the first selector material is provided around the first electrode.

18. The semiconductor storage device according to claim 16, wherein the first selector material includes one of arsenic (As), phosphorus (P), antimony (Sb), and boron (B) as the first impurity.

19. The semiconductor storage device according to claim 16, wherein an area of the first electrode on a side of the first selector material is less than an area of the first electrode on a side of the variable resistance element when viewed in the stacking direction.

20. The semiconductor storage device according to claim 16, wherein an area of the first electrode on a side of the variable resistance element is less than an area of the variable resistance element on a side of the first electrode when viewed in the stacking direction.

* * * * *